United States Patent
Lee et al.

(10) Patent No.: US 9,618,815 B2
(45) Date of Patent: Apr. 11, 2017

(54) METHOD OF MANUFACTURING DISPLAY SUBSTRATE, REPAIR METHOD OF DISPLAY SUBSTRATE AND DISPLAY SUBSTRATE REPAIRED BY THE REPAIR METHOD

(71) Applicant: Samsung Display Co., Ltd., Yongin, Gyeonggi-Do (KR)

(72) Inventors: Hong-Beom Lee, Hwaseong-si (KR); Kyoung-Hae Min, Asan-si (KR); Yeon-Ha Baek, Jinju-si (KR); Ji-Hoon Shin, Asan-si (KR); Ho-Yong Shin, Suwon-si (KR); Jae-Hyun Lee, Anyang-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/694,826

(22) Filed: Apr. 23, 2015

(65) Prior Publication Data

US 2016/0139472 A1    May 19, 2016

(30) Foreign Application Priority Data

Nov. 18, 2014  (KR) .......................... 10-2014-0160797

(51) Int. Cl.
*G02F 1/1362* (2006.01)
*H01L 27/12* (2006.01)
(Continued)

(52) U.S. Cl.
CPC .. *G02F 1/136259* (2013.01); *G02F 1/136286* (2013.01); *G09G 3/20* (2013.01);
(Continued)

(58) Field of Classification Search
CPC .......................... H01L 27/124; H01L 27/1259
See application file for complete search history.

(56) References Cited

U.S. PATENT DOCUMENTS

2005/0078252 A1   4/2005  Lin
2008/0117344 A1   5/2008  Kim et al.
(Continued)

FOREIGN PATENT DOCUMENTS

EP   1865372 A1   12/2007
KR   0186204 B1   12/1998
(Continued)

OTHER PUBLICATIONS

European Search Report issued by the European Patent Office on Jan. 25, 2016 for European Patent Application No. 15172094.3.

*Primary Examiner* — Mamadou Diallo
(74) *Attorney, Agent, or Firm* — Robert E. Bushnell, Esq.

(57) ABSTRACT

A display substrate includes a gate metal pattern comprising a gate line extending in a first direction and a gate electrode electrically connected to the gate line, a data metal pattern comprising a data line extending in a second direction crossing the first direction, a source electrode electrically connected to the data line and a drain electrode spaced apart from the source electrode, an organic layer disposed on the data metal pattern, a repair hole penetrating the organic layer and exposing a crossing area in which the gate line crosses with the data line and a pixel electrode disposed on the organic layer and electrically connected to the drain electrode.

5 Claims, 22 Drawing Sheets

(51) Int. Cl.
*H01L 21/768* (2006.01)
*G09G 3/20* (2006.01)
*G09G 3/36* (2006.01)
*G02F 1/13* (2006.01)
*H01L 21/66* (2006.01)
*H01L 21/48* (2006.01)

(52) U.S. Cl.
CPC ..... *G09G 3/3648* (2013.01); *H01L 21/76894* (2013.01); *H01L 27/124* (2013.01); *H01L 27/1259* (2013.01); *G02F 1/1309* (2013.01); *G02F 1/136227* (2013.01); *G02F 2001/136222* (2013.01); *G02F 2001/136263* (2013.01); *G02F 2201/42* (2013.01); *G09G 2300/0426* (2013.01); *G09G 2330/08* (2013.01); *G09G 2330/12* (2013.01); *H01L 21/485* (2013.01); *H01L 22/22* (2013.01); *H01L 27/1248* (2013.01); *H01L 2221/101* (2013.01)

(56) References Cited

U.S. PATENT DOCUMENTS

| | | | |
|---|---|---|---|
| 2009/0262049 A1* | 10/2009 | Yoon | H01L 27/3276 345/76 |
| 2010/0155734 A1* | 6/2010 | Lee | G02F 1/136259 257/59 |
| 2014/0117860 A1 | 5/2014 | Kim et al. | |
| 2014/0332767 A1* | 11/2014 | Jin | H01L 29/42384 257/40 |

FOREIGN PATENT DOCUMENTS

| | | |
|---|---|---|
| KR | 10-2008-0008598 A | 1/2008 |
| KR | 10-2008-0009652 A | 1/2008 |
| KR | 10-2010-0003804 A | 1/2010 |

* cited by examiner

METHOD OF MANUFACTURING DISPLAY SUBSTRATE, REPAIR METHOD OF DISPLAY SUBSTRATE AND DISPLAY SUBSTRATE REPAIRED BY THE REPAIR METHOD

CLAIM OF PRIORITY

This application claims the priority of and all the benefits accruing under 35 U.S.C. §119 to Korean Patent Application No. 10-2014-0160797, filed on Nov. 18, 2014 in the Korean Intellectual Property Office ("KIPO"), the contents of which are herein incorporated by reference in their entireties.

BACKGROUND OF THE INVENTION

Field of the Invention

Exemplary embodiments of the present inventive concept relate to a method of manufacturing a display substrate, a method of repairing a display substrate and a display substrate repaired by the method of repairing a display substrate.

Description of the Related Art

Generally, a liquid crystal display (LCD) panel includes a thin film transistor (TFT) substrate, an opposing substrate and an LC layer. The TFT substrate includes a plurality of gate lines, a plurality of data lines crossing the gate lines, a plurality of TFTs connected with the gate lines and data lines, and a plurality of pixel electrodes connected with the TFTs. The TFT includes a gate electrode extended from the gate line, a source electrode extended to the data line, and a drain electrode spaced apart from the source electrode.

The signal line of the array substrate may have an electrical connection failure such as a short circuit, a shorting failure, etc. When the electrical connection failure is generated, a display quality of the LCD panel is deteriorated. Therefore, it is necessary to repair the signal line having the electrical connection failure.

A conventional method of repairing the signal line is forming a repairing line on the protecting layer. The repairing line is electrically connected to the signal line to repair the electrical connection failure.

However, when a color filter is disposed on the same lower substrate as the gate line and the data line, the color filter covers the data line. Thus, possibility of failure for repairing may be increased. In addition, a repair line is not contacted with the data line, a repair may be impossible.

SUMMARY OF THE INVENTION

Exemplary embodiments of the present inventive concept provide a method of manufacturing a display substrate capable of repairing.

Exemplary embodiments of the present inventive concept further provide a method of repairing a display substrate.

Exemplary embodiments of the present inventive concept further provide a display substrate repaired by the method of repairing a display substrate.

In an exemplary embodiment of a display substrate according to the present inventive concept, the display substrate includes a gate metal pattern comprising a gate line extending in a first direction and a gate electrode electrically connected to the gate line, a data metal pattern comprising a data line extending in a second direction crossing the first direction, a source electrode electrically connected to the data line and a drain electrode spaced apart from the source electrode, an organic layer disposed on the data metal pattern, a repair hole penetrating the organic layer and exposing a crossing area in which the gate line crosses with the data line and a pixel electrode disposed on the organic layer and electrically connected to the drain electrode.

In an exemplary embodiment, the display substrate may further include a repair line disposed on the crossing area and electrically connected to the data line.

In an exemplary embodiment, the display substrate may further include a covering pattern covering the repair hole.

In an exemplary embodiment, the display substrate may further include a repair electrode covering the repair hole and disposed on the same layer as the pixel electrode.

In an exemplary embodiment, the display substrate may further include a covering pattern covering the repair hole and the repair electrode.

In an exemplary embodiment of a method of manufacturing a display substrate according to the present inventive concept, the method includes forming a gate metal pattern comprising a gate line extending in a first direction and a gate electrode electrically connected to the gate line on a base substrate, forming a data metal pattern comprising a data line extending in a second direction crossing the first direction, a source electrode electrically connected to the data line and a drain electrode spaced apart from the source electrode on the gate metal pattern, forming an organic layer on the data metal pattern, patterning the organic layer to form a repair hole exposing a crossing area in which the gate line crosses with the data line and forming a pixel electrode electrically connected to the drain electrode on the organic layer.

In an exemplary embodiment, an extent of the repair hole may be bigger than an extent of the crossing area in which the gate line crosses with the data line.

In an exemplary embodiment, the organic layer may be a color filter.

In an exemplary embodiment, the method may further include forming a repair electrode covering the repair hole.

In an exemplary embodiment, the repair electrode may be formed from the same layer as the pixel electrode.

In an exemplary embodiment, an extent of the repair hole may be bigger than an extent of the crossing area in which the gate line crosses with the data line.

In an exemplary embodiment, the organic layer may be a color filter.

In an exemplary embodiment of method of repairing a display substrate according to the present inventive concept, the method includes forming a first and a second cutting grooves to disconnect the data line, wherein an electrical connection failure results in a shorting failure that is generated at a place where the gate line and the data line cross each other and disposed between the first and second disconnecting grooves and connecting the disconnected data line.

In an exemplary embodiment, connecting the disconnected data line may include forming a repair line electrically connecting the disconnected data line. The repair line may include the same material as the data line.

In an exemplary embodiment, the repair line may be formed through a laser chemical vapor deposition (CVD) method.

In an exemplary embodiment, the method may further include forming a covering pattern covering the repair hole.

In an exemplary embodiment, the method may further include forming a repair electrode covering the repair hole. Connecting the disconnected data line may include connecting the repair electrode and the disconnected data line. The repair electrode may include a transparent conductive material.

In an exemplary embodiment, forming the first and the second cutting grooves may include irradiating a laser beam to the repair electrode.

In an exemplary embodiment, connecting the disconnected data line may include irradiating a laser beam to the repair electrode to connect the repair electrode and the data line.

In an exemplary embodiment, the method may further include forming a covering pattern covering the repair electrode.

According to the present exemplary embodiment, a display substrate includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

In addition, a display substrate includes covering pattern covering the first repair hole. Thus, defects of line due to foreign materials may be prevented. In addition, since the covering pattern fills a space of the repair hole, a difference of height due to the repair hole RH1 may be decreased.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTION

Hereinafter, the present invention will be explained in detail with reference to the accompanying drawings.

Figure 1:
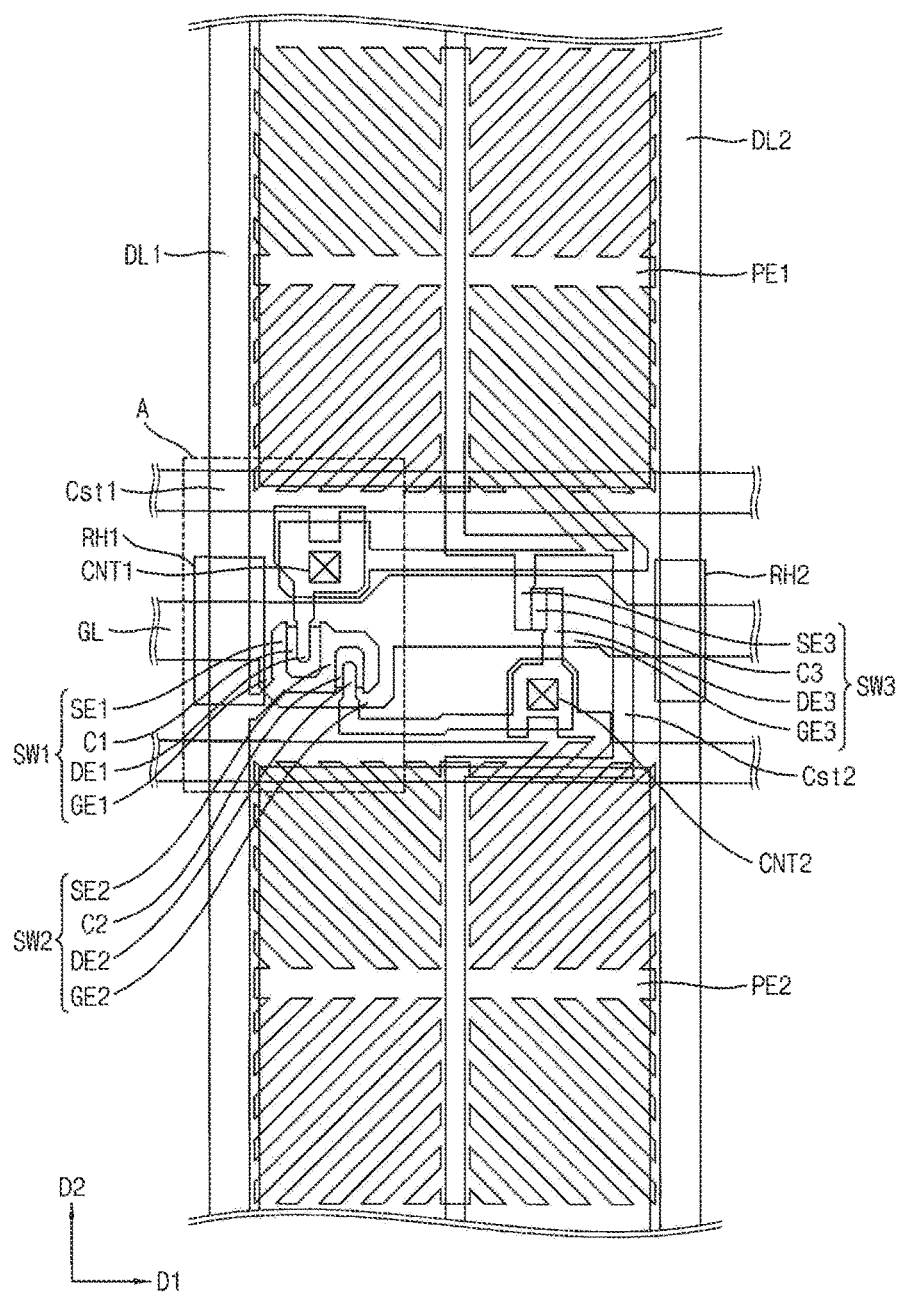
FIG. 1 is a plan view illustrating a display substrate according to an exemplary embodiment of the inventive concept.
Figure 2:
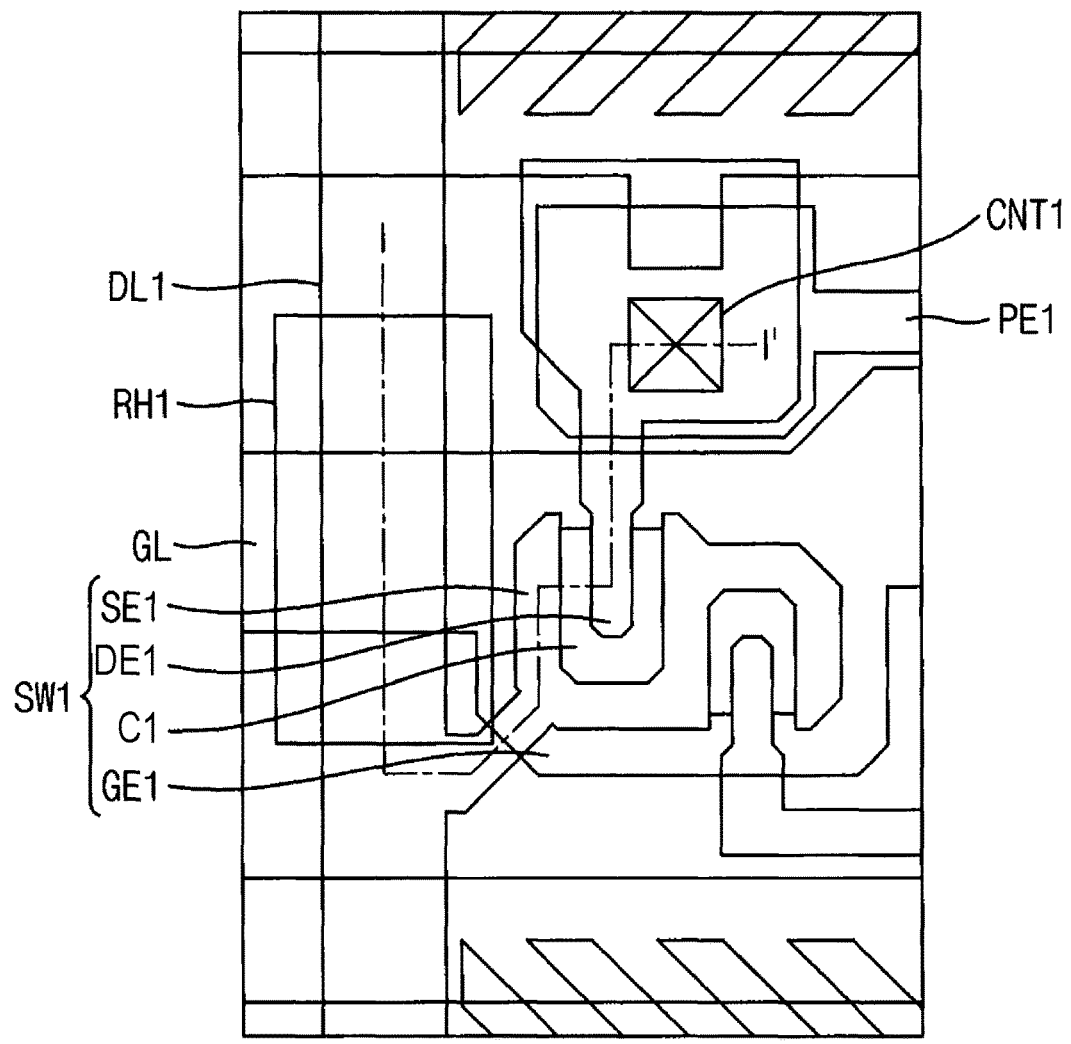
FIG. 2 is a plan view magnifying portion "A" of FIG. 1.
Figure 3:
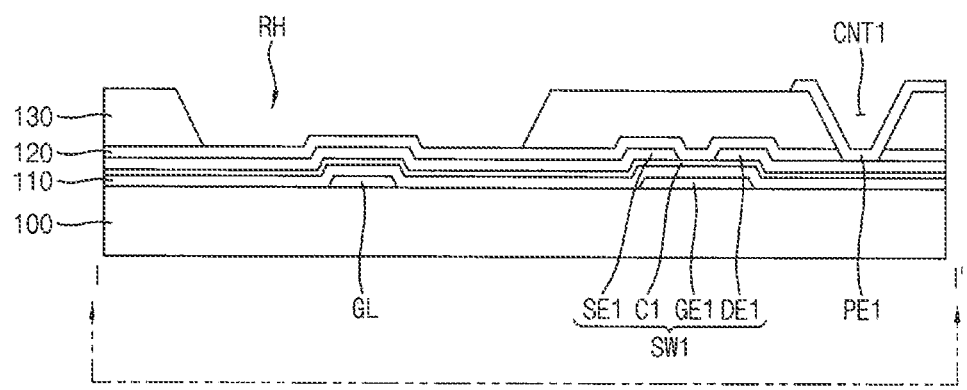
FIG. 3 is a cross-sectional view taken along the line I-I' of FIG. 2.

FIG. 1 is a plan view illustrating a display substrate according to an exemplary embodiment of the inventive concept. FIG. 2 is a plan view magnifying portion "A" of FIG. 1. FIG. 3 is a cross-sectional view taken along the line I-I' of FIG. 2.

Referring to FIGS. 1 to 3, a display substrate includes a gate line GL, a first data line DL1, a second data line DL2, a first repair hole RH1, a second repair hole RH2, a first storage line Cst1, a second storage line Cst2, a first switching element SW1, a second switching element SW2, a third switching element SW3, a high-pixel electrode PE1 and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. In addition, the gate line GL may have a multi-layer structure having a plurality of layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first data line DL1 extends in a second direction D2 substantially perpendicular to the first direction D1. The first data line DL1 may have a single layer structure including copper (Cu), silver (Ag), chrome (Cr), molybdenum (Mo), aluminum (Al), titanium (Ti), manganese (Mn) and a mixture thereof. In addition, the first data line DL1 may have a multi-layer structure having a plurality of layers including materials different from each other. For example, the first data line DL1 may include a copper layer and a titanium layer disposed on and/or under the copper layer. The first data line DL1 is electrically connected to a first source electrode SE1 of the first switching element SW1, and a second source electrode SE2 of the second switching element SW2.

The high-pixel electrode PE1 is disposed adjacent to the gate line GL in the second direction D2, and between the first data line DL1 and the second data line DL2. The high-pixel electrode PE1 is electrically connected to a first drain electrode DE1 of the first switching element SW1 through a first contact hole H1.

The low-pixel electrode PE2 is disposed opposite to the high-pixel electrode PE1 with reference to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole H2.

A first voltage may be applied to the high-pixel electrode PE1. A second voltage different from the first voltage may be applied to the low-pixel electrode PE2. For example, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel.

The first storage line Cst1 extends in a first direction D1. The first storage line Cst1 overlaps with the high-pixel electrode PE1. The first storage line Cst1 may be formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) and a mixture thereof. In addition, the first storage line Cst1 may have a multi-layer structure having a plurality of layers including materials different from each other. For example, the first storage line Cst1 may include a copper layer and a titanium layer disposed on and/or under the copper layer.

The second storage line Cst2 may be formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different from each other. For example, the second storage line Cst2 may include a copper layer and a titanium layer disposed on and/or under the copper layer. The second storage line Cst2 is electrically connected to a third source electrode SE3 of the third switching element SW3.

A second insulation layer 120 is formed on the first data line DL1 and the second storage line Cst2. The second insulation layer 120 may include inorganic material such as silicon oxide (SiOx) and/or silicon nitride (SiNx). For example, the second insulation layer 120 includes silicon oxide (SiOx), and may have thickness about 500 Å. In addition, the second insulation layer 120 may include a plurality of layers including materials different from each other.

An organic layer 130 is formed on the second insulation layer 120. The organic insulating layer 130 may planarizes an upper surface of the display substrate, so that problems due to the step such as disconnection of a signal line may be prevented. The organic layer 130 may be an insulation layer including an organic material. For example, the organic layer 130 may be a color filter layer.

A pixel electrode is formed on the organic layer 130. The pixel electrode may include a high-pixel electrode PE1 and a low-pixel electrode PE2.

The high-pixel electrode PE1 and the low-pixel electrode PE2 may include a transparent conductive material, such as indium tin oxide (ITO), indium zinc oxide (IZO) and etc. In addition, the high-pixel electrode PE1 and the low-pixel electrode PE2 may include titanium (Ti) and/or molybdenum titanium (MoTi).

A repair hole is formed through the organic layer 130. The repair hole may include a first repair hole RH1 and a second repair hole RH2. The first repair hole RH1 is disposed in a crossing area in which the first data line DL1 crosses with the gate line GL. The second repair hole RH2 is disposed in a crossing area in which the second data line DL2 crosses with the gate line GL.

The first repair hole RH1 exposes the crossing area in which the first data line DL1 crosses with the gate line GL. An extent of the first repair hole RH1 may be bigger than an extent of the crossing area in which the first data line DL1 crosses with the gate line GL.

The first switching element SW1 includes the first gate electrode GE1, the first source electrode SE1, the first drain electrode DE1 and a first channel portion C1 connecting the first source electrode SE1 to the first drain electrode DEL The first channel portion C1 may include a semiconductor layer consisting of amorphous silicon (a-Si:H) and an ohmic contact layer consisting of n+ amorphous silicon (n+ a-Si:H). In addition, the first channel portion C1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion C2 connecting the second source electrode SE2 to the second drain electrode DE2.

The second channel portion C2 may include a semiconductor layer consisting of amorphous silicon (a-Si:H) and an ohmic contact layer consisting of n+ amorphous silicon (n+ a-Si:H). In addition, the second channel portion C2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion C3 connecting the third source electrode SE3 to the third drain electrode DE3.

The third channel portion C3 may include a semiconductor layer consisting of amorphous silicon (a-Si:H) and an ohmic contact layer consisting of n+ amorphous silicon (n+a-Si:H). In addition, the third channel portion C3 may include an oxide semiconductor. The oxide semiconductor may include an amorphous oxide including at least one selected from the group consisting of indium (In), zinc (Zn), gallium (Ga), tin (Sn) and hafnium (Hf).

When a color filter is disposed on the same lower substrate as the gate line and the data line, the color filter covers the data line. Thus, a repair of the data line is impossible. That is, since the color filter covers the data line, a cutting using a laser may be failed. In addition, since a repair line is not contacted with the data line, a repair may be impossible.

However, a display substrate according to an exemplary embodiment of the inventive concept includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

FIGS. 4 to 8 are cross-sectional views illustrating a method of manufacturing the display substrate of FIG. 3.

Figure 4:
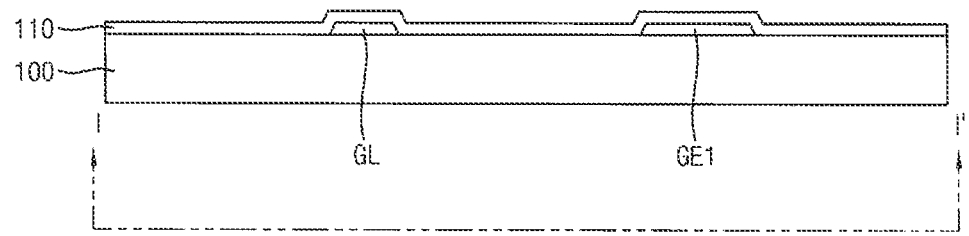
FIGS. 4 to 8 are cross-sectional views illustrating a method of manufacturing the display substrate of FIG. 3.

Referring to FIG. 4, a gate metal layer is formed on a base substrate 100, and then the gate metal layer may be partially etched by a photolithography process or an etching process using an additional etching mask. Hence, the gate pattern is formed. The gate pattern includes a first storage line Cst1, a gate line GL, a first gate electrode GE1, a second gate electrode GE2 and a third gate electrode GE3.

The base substrate 100 may include a material which has relatively high transmittance, thermal resistance, and chemical resistance. For example the base substrate 100 may include any one selected from the group consisting of glass, polyethylenenaphthalate, polyethylene terephthalate, polyacryl and a mixture thereof.

The gate pattern may include a metal, a metal alloy, a metal nitride, a conductive metal oxide, a transparent conductive material, and etc. For example, the gate pattern may include copper (Cu) which is opaque.

The first insulation layer 110 is disposed on the base substrate on which gate pattern is formed. The first insulation layer 110 is disposed on the gate pattern. The first insulation layer 110 covers and insulates the first storage line Cst1, the gate line GL, the first gate electrode GE1, the second gate electrode GE2 and the third gate electrode GE3.

Figure 5:
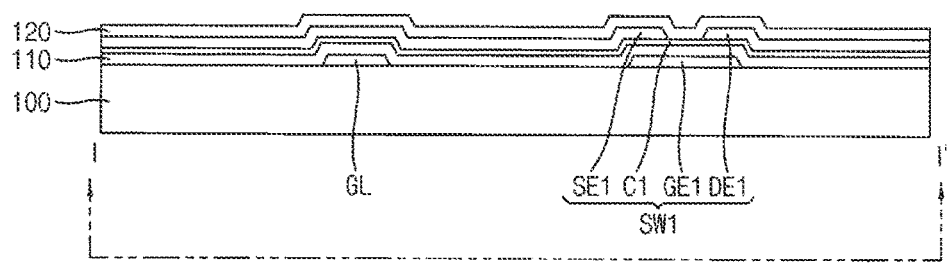

Referring to FIG. 5, a semiconductor layer and a data metal layer are formed on a base substrate 100 on which the first insulation layer 110 is formed, and then the semiconductor layer and the data metal layer may be partially etched by a photolithography process or an etching process using an additional etching mask. Hence, a channel layer AP including a first channel portion C1, a second channel portion C2 and a third channel portion C3, and data pattern are formed. The semiconductor layer may include a silicon semiconductor layer consisting of amorphous silicon (a-Si:H) and an ohmic contact layer consisting of n+ amorphous silicon (n+ a-Si:H). In addition, the semiconductor layer may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line DL1 and a second data line DL2. For example, the semiconductor later and the metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 and the second drain electrode DE2 spaced apart from the second source electrode SE2 may be formed by removing a portion of the patterned metal layer. In addition, the third source electrode SE3 and the third drain electrode DE3 spaced apart from the third source electrode SE3 may be formed by removing a portion of the patterned metal layer.

A second insulation layer 120 is formed on the base substrate 100 on which the data pattern and the channel layer AP are formed.

The second insulation layer 120 may be formed by a spin coating process, a printing process, a sputtering process, a CVD process, an ALD process, a PECVD process, an HDP-CVD process or a vacuum evaporation process in accordance with ingredients included in the second insulation layer 120. The second insulation layer 120 is disposed on the data pattern. The second insulation layer 120 covers and insulates the first drain electrode DE1, the first source electrode SE1, the second source electrode SE2, the second drain electrode DE2, the third source electrode SE3, the third drain electrode DE3 and the first data line (refers to DL 1 of FIG. 1).

Figure 6:
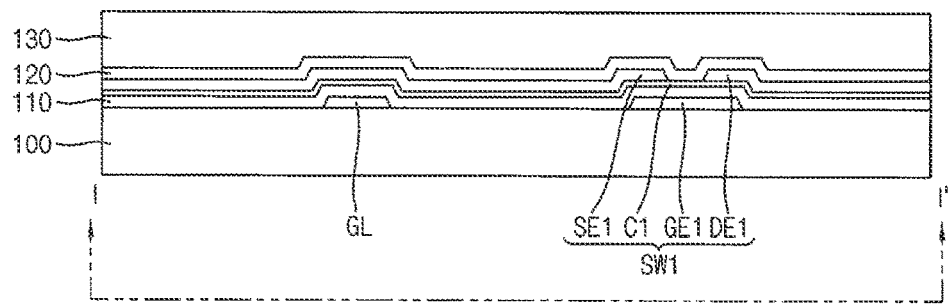

Referring to FIG. 6, an organic layer 130 is formed on the base substrate 100 on which the second insulation layer 120 is formed. The organic layer 130 may be a color filter layer. A photoresist is formed on the second insulation layer 120, and then the photoresist is exposed using a mask, and then the photoresist is developed using a developing solution. Hence, the organic layer 130 may be formed.

The organic layer 130 is disposed on the second insulation layer 120. When the organic layer 130 is color filter layer, the color filter layer supplies colors to the light passing through the liquid crystal layer. The color filter layer may include a red color filter layer, a green color filter layer and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 7:
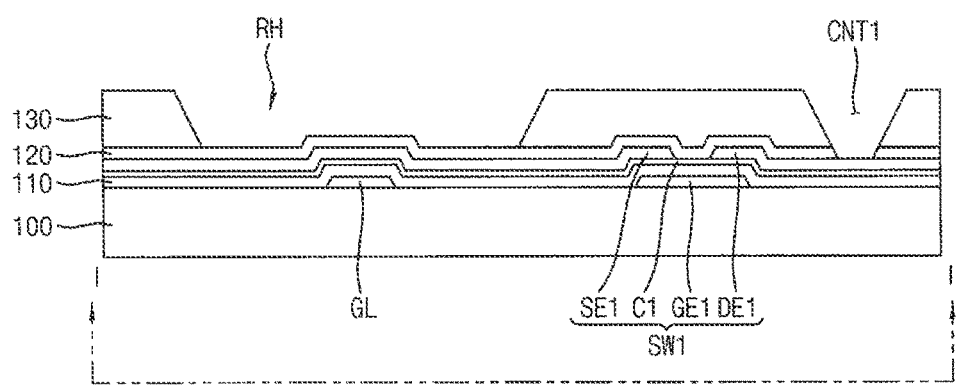
Figure 8:
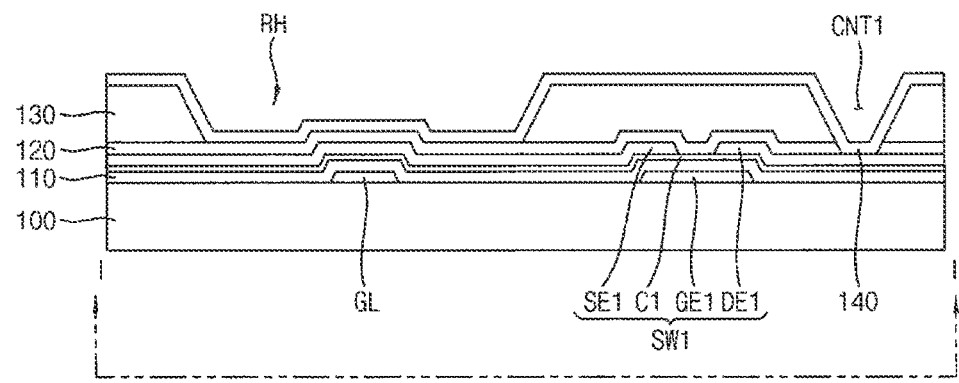

Referring to FIG. 7, the organic layer 130 is patterned to form a first repair hole RH1 and a first contact hole CNT1.

The first repair hole RH1 is disposed in a crossing area in which the first data line DL1 crosses with the gate line GL. The first repair hole RH1 exposes the crossing area in which the first data line DL1 crosses with the gate line GL. An extent of the first repair hole RH1 may be bigger than an extent of the crossing area in which the first data line DL1 crosses with the gate line GL.

The first contact hole CNT1 is formed through the organic layer 130 and the second insulation layer 120. The first contact hole CNT1 exposes a portion of the first drain electrode DEL Referring to FIG. 8, a transparent electrode layer 140 is formed of the base substrate 100 on which the first repair hole RH1 and the first contact hole CNT1 are formed. The transparent electrode layer 140 may include a transparent conductive material, such as indium tin oxide (ITO), indium zinc oxide (IZO) and etc. In addition, the transparent electrode layer 140 may include titanium (Ti) and/or molybdenum titanium (MoTi).

Referring to FIG. 3, the transparent electrode layer 140 is patterned to form a high-pixel electrode PE1.

The high-pixel electrode PE1 may include a transparent conductive material, such as indium tin oxide (ITO), indium zinc oxide (IZO) and etc. In addition, the high-pixel electrode PE1 may include titanium (Ti) and/or molybdenum titanium (MoTi).

The high-pixel electrode PE1 is electrically connected to the first drain electrode DE1 through the first contact hole CNT1.

When a color filter is disposed on the same lower substrate as the gate line and the data line, the color filter covers the data line. Thus, a repair of the data line is impossible. That is, since the color filter covers the data line, a cutting using a laser may be failed. In addition, since a repair line is not contacted with the data line, a repair may be impossible.

However, a display substrate according to an exemplary embodiment of the inventive concept includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

Figure 9:
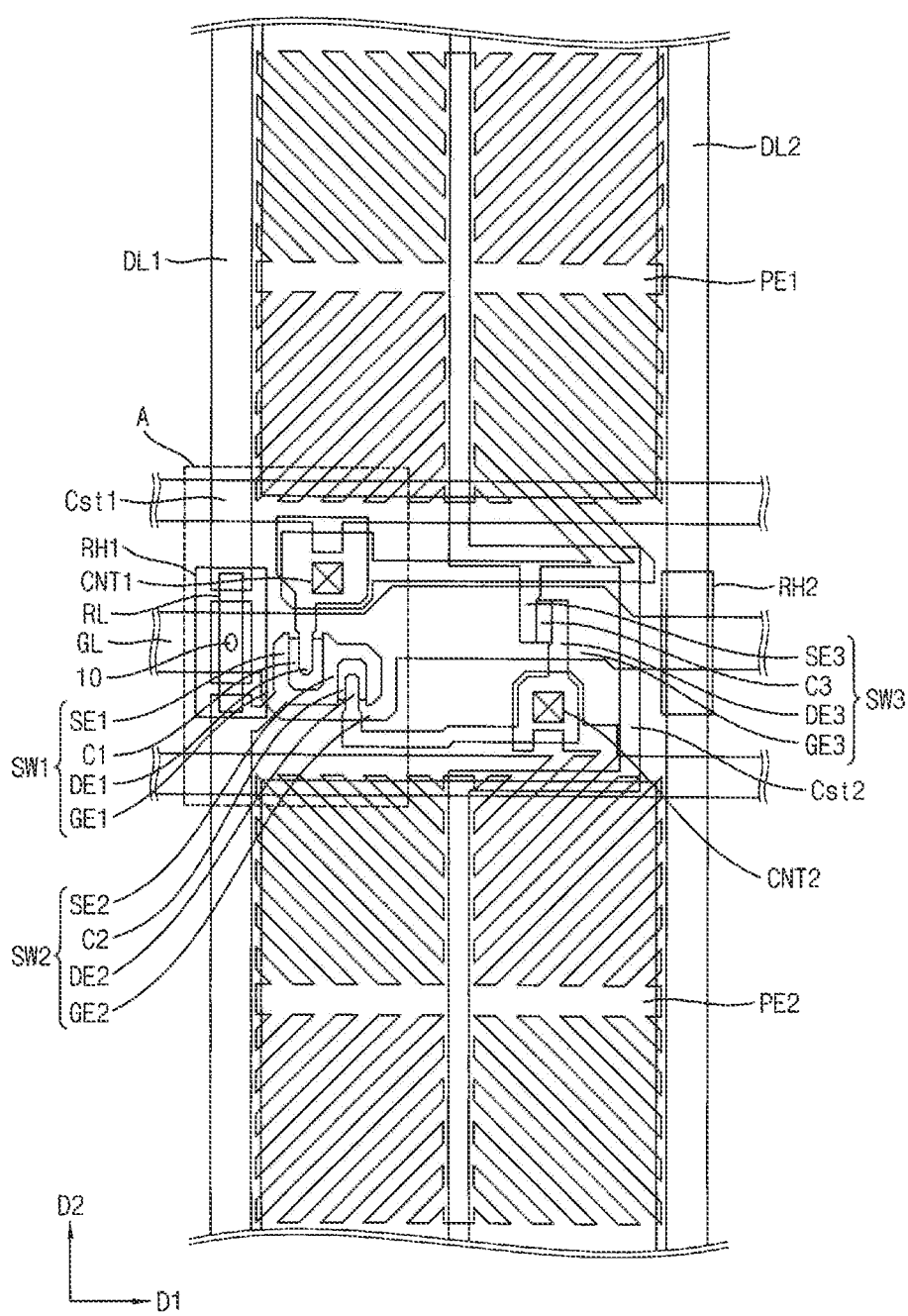
FIG. 9 is a plan view illustrating a display substrate repaired by a method of repairing a display substrate according to an exemplary embodiment of the inventive concept.

FIG. 9 is a plan view illustrating a display substrate repaired by a method of repairing a display substrate according to an exemplary embodiment of the inventive concept.

Figure 10:
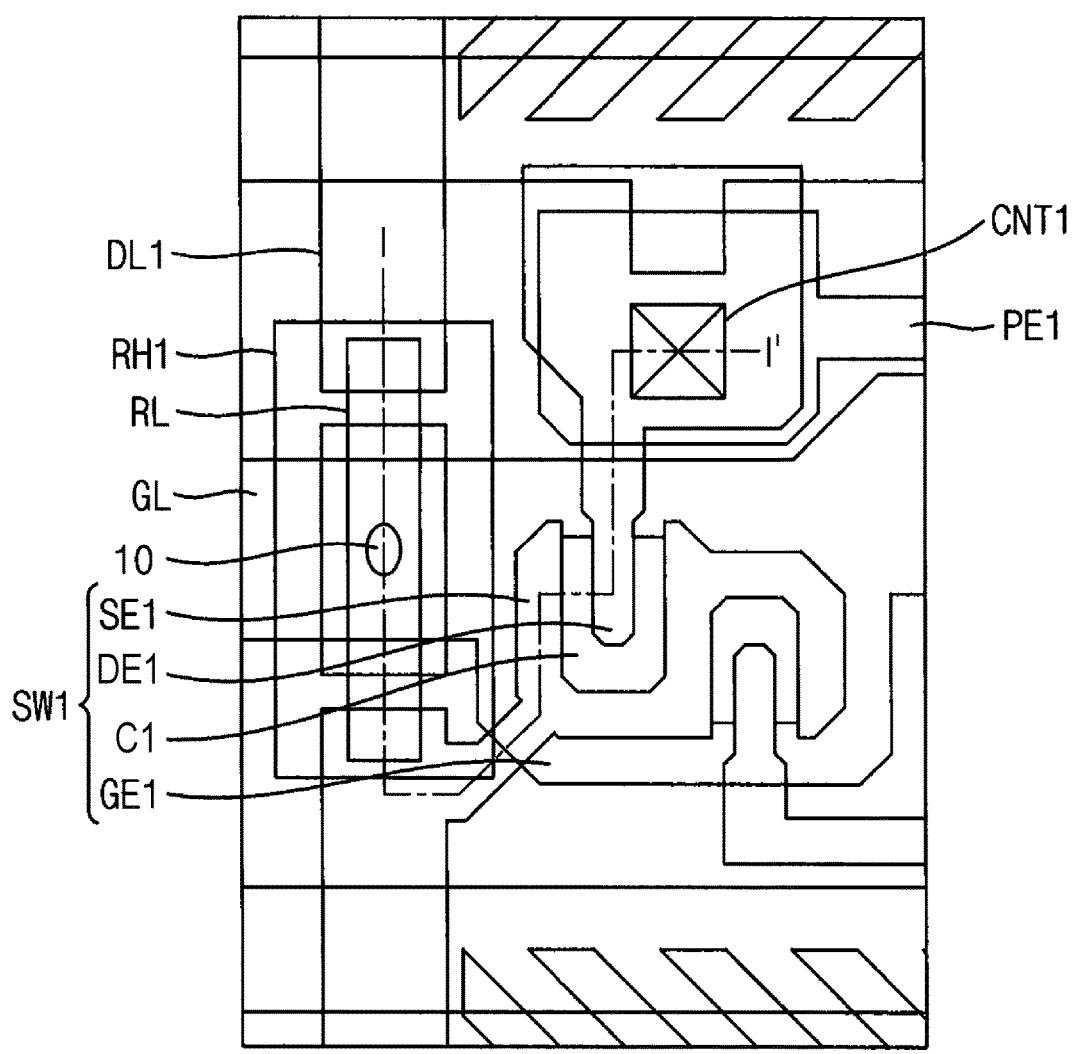
FIG. 10 is a plan view magnifying portion "A" of FIG. 9.
Figure 11:
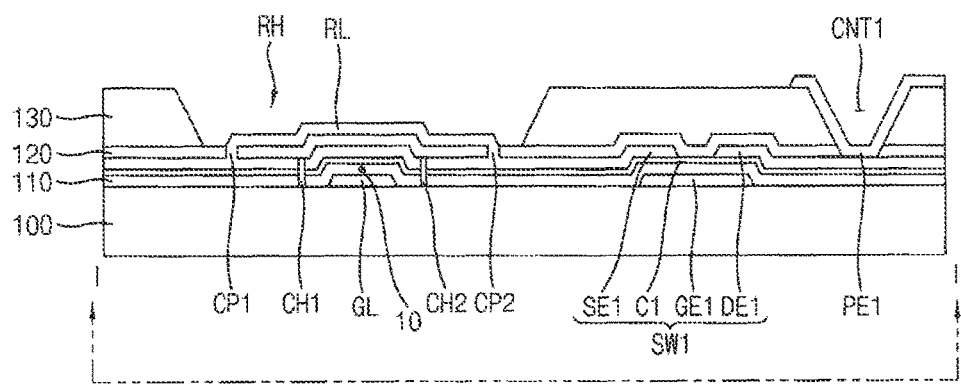
FIG. 11 is a cross-sectional view taken along the line I-I' of FIG. 10.

FIG. 10 is a plan view magnifying portion "A" of FIG. 9. FIG. 11 is a cross-sectional view taken along the line I-I' of FIG. 10.

Referring to FIGS. 9 to 11, a shorting failure 10 is generated at a crossing area in which the first data line GL1 crosses with the gate line GL.

A first cutting groove CH1 and a second cutting groove CH2 are formed to disconnect the first data line DL1. An electrical connection failure results in a shorting failure 10 that is generated at a crossing area in which the gate line and the data line cross each other and disposed between the first and second disconnecting grooves. Particularly, a laser beam is irradiated onto the first data line DL1 along a first direction D1 substantially perpendicular to a longitudinal direction of the first data line DL1 to form the first and second cutting grooves CH1 and CH2. The laser beam may be a pulse laser beam. For example, Examples of a wavelength of the pulse laser beam may be about 1063 nm, about 532 nm, about 355 nm, etc.

Thereafter, a repair line RL is formed in the first repair hole RH1. The repair line RL electrically connects the disconnected first data line DL1. The repair line RL may include the same material as the first data line DL1. The repair line RL may have a single layer structure including copper (Cu), silver (Ag), chrome (Cr), molybdenum (Mo), aluminum (Al), titanium (Ti), manganese (Mn) and a mixture thereof. In addition, the repair line RL may have a multi-layer structure having a plurality of layers including materials different from each other. For example, the repair line RL may include a copper layer and a titanium layer disposed on and/or under the copper layer.

The repair line RL may be formed through a laser chemical vapor deposition (CVD) method. The laser CVD method partially irradiates a laser beam onto an abject to deposit a vaporized material where the laser beam is irradiated. That is, a laser beam is irradiated onto the disconnected first data line DL1 to deposit the repair line RL in the first repair hole RH1. A material that may be used for the repair line RL is substantially the same as the material that may be used for the first data line DL1. The repair line RL is electrically connected to the first data line DL1 on a first connecting point CP1 and a second connecting point CP2.

The repair line RL is formed in the first repair hole RH1, and electrically connects the first data line DL1 that is electrically insulated from each other by the first and second cutting grooves CH1 and CH2. Thus, the repair line RL may repair the shorting failure 10 to repair the display substrate 100.

Figure 12:
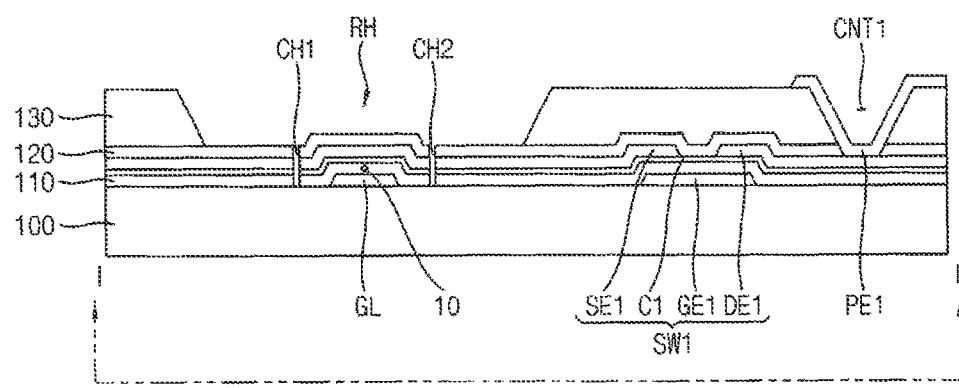
FIG. 12 is a cross-sectional view illustrating a method of repairing a display substrate of FIG. 11.

FIG. 12 is a cross-sectional view illustrating a method of repairing a display substrate of FIG. 11.

Referring to FIG. 12, a first cutting groove CH1 and a second cutting groove CH2 are formed to disconnect the first data line DL1. An electrical connection failure results in a shorting failure 10 that is generated at a crossing area in which the gate line and the data line cross each other and disposed between the first and second disconnecting grooves. Particularly, a laser beam is irradiated onto the first data line DL1 along a first direction D1 substantially perpendicular to a longitudinal direction of the first data line DL1 to form the first and second cutting grooves CH1 and CH2. The laser beam may be a pulse laser beam. For example, Examples of a wavelength of the pulse laser beam may be about 1063 nm, about 532 nm, about 355 nm, etc.

The first data line DL1 is insulated by the first cutting groove CH1 and the second cutting groove CH2.

Referring to FIG. 11, a repair line RL is formed in the first repair hole RH1. The repair line RL electrically connects the disconnected first data line DL1. The repair line RL is electrically connected to the first data line DL1 on a first connecting point CP1 and a second connecting point CP2.

The repair line RL may be formed through a laser chemical vapor deposition (CVD) method. The laser CVD method partially irradiates a laser beam onto an abject to deposit a vaporized material where the laser beam is irradiated. That is, a laser beam is irradiated onto the disconnected first data line DL1 to deposit the repair line RL in the first repair hole RH1. A material that may be used for the repair line RL is substantially the same as the material that may be used for the first data line DL1.

The repair line RL is formed in the first repair hole RH1, and electrically connects the first data line DL1 that is electrically insulated from each other by the first and second cutting grooves CH1 and CH2. Thus, the repair line RL may repair the shorting failure 10 to repair the display substrate 100.

Figure 13:
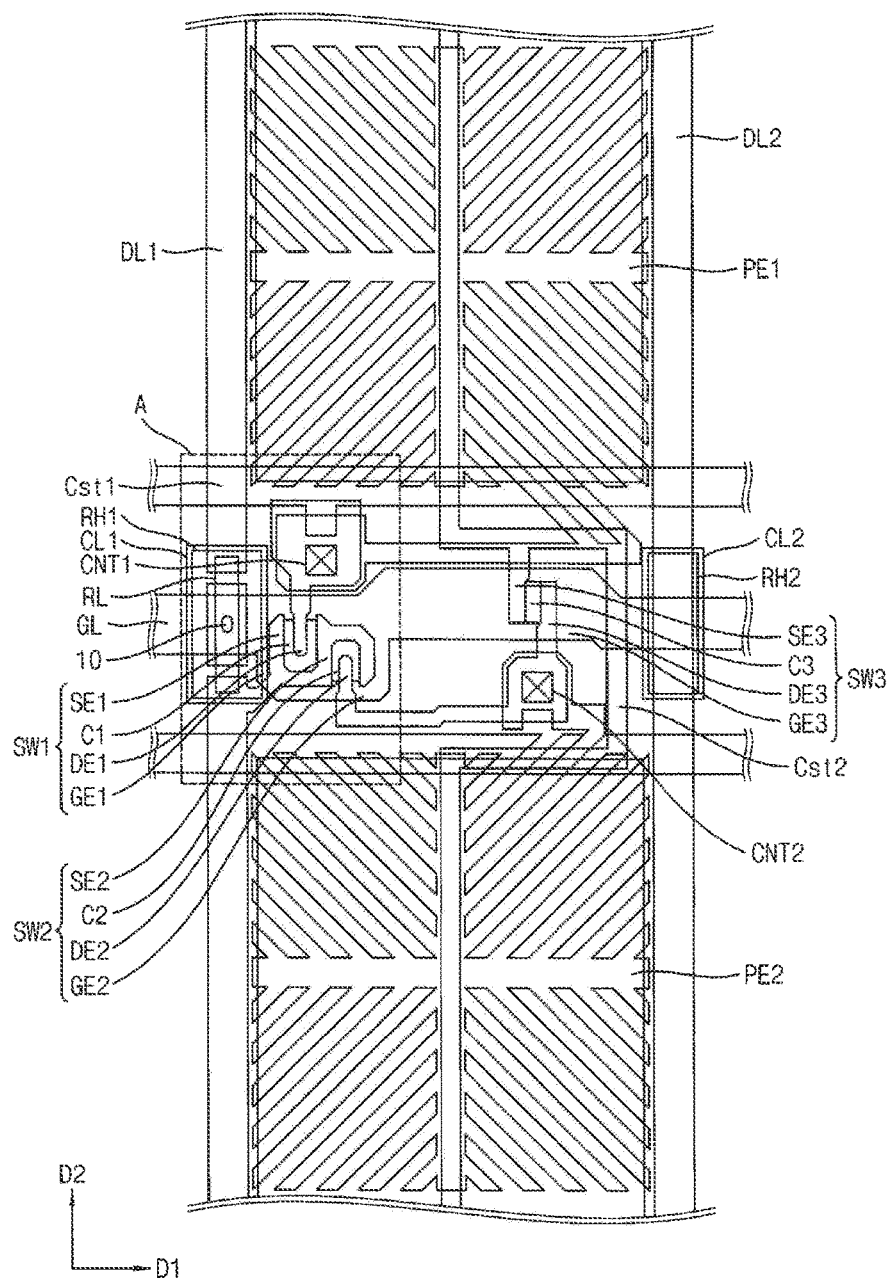
FIG. 13 is a plan view illustrating a display substrate repaired by a method of repairing a display substrate according to an exemplary embodiment of the inventive concept.
Figure 14:
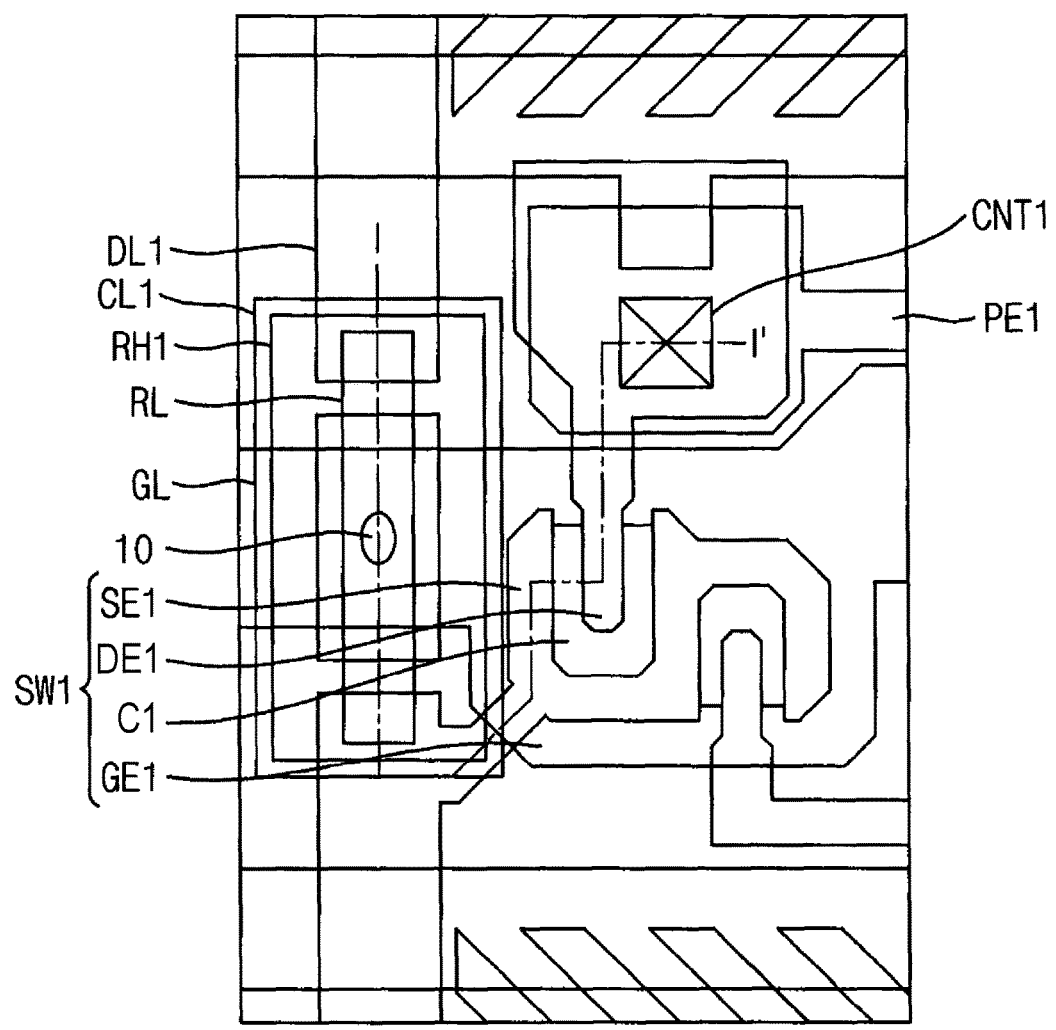
FIG. 14 is a plan view magnifying portion "A" of FIG. 13.
Figure 15:
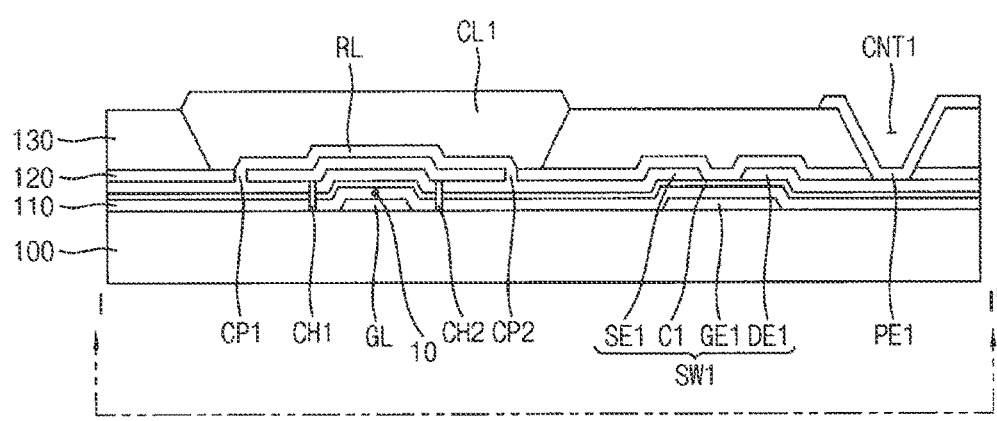
FIG. 15 is a cross-sectional view taken along the line I-I' of FIG. 14.

FIG. 13 is a plan view illustrating a display substrate repaired by a method of repairing a display substrate according to an exemplary embodiment of the inventive concept. FIG. 14 is a plan view magnifying portion "A" of FIG. 13. FIG. 15 is a cross-sectional view taken along the line I-I' of FIG. 14.

Referring to FIGS. 13 to 15, a first covering pattern CL1 is formed. The first covering pattern CL1 covers the first repair hole RH1 in which the repair line RL is formed.

The first covering pattern CL1 covers the first repair hole RH1 and the repair line RL. The first covering pattern CL1 may disposed on the same layer as a column spacer. (not shown)

The first covering pattern CL1 covers the first repair hole RH1. Thus, defects of line due to foreign materials may be prevented. In addition, since the first covering pattern CL1 fills a space of the first repair hole RH1, a difference of height due to the first repair hole RH1 may be decreased.

Figure 16:
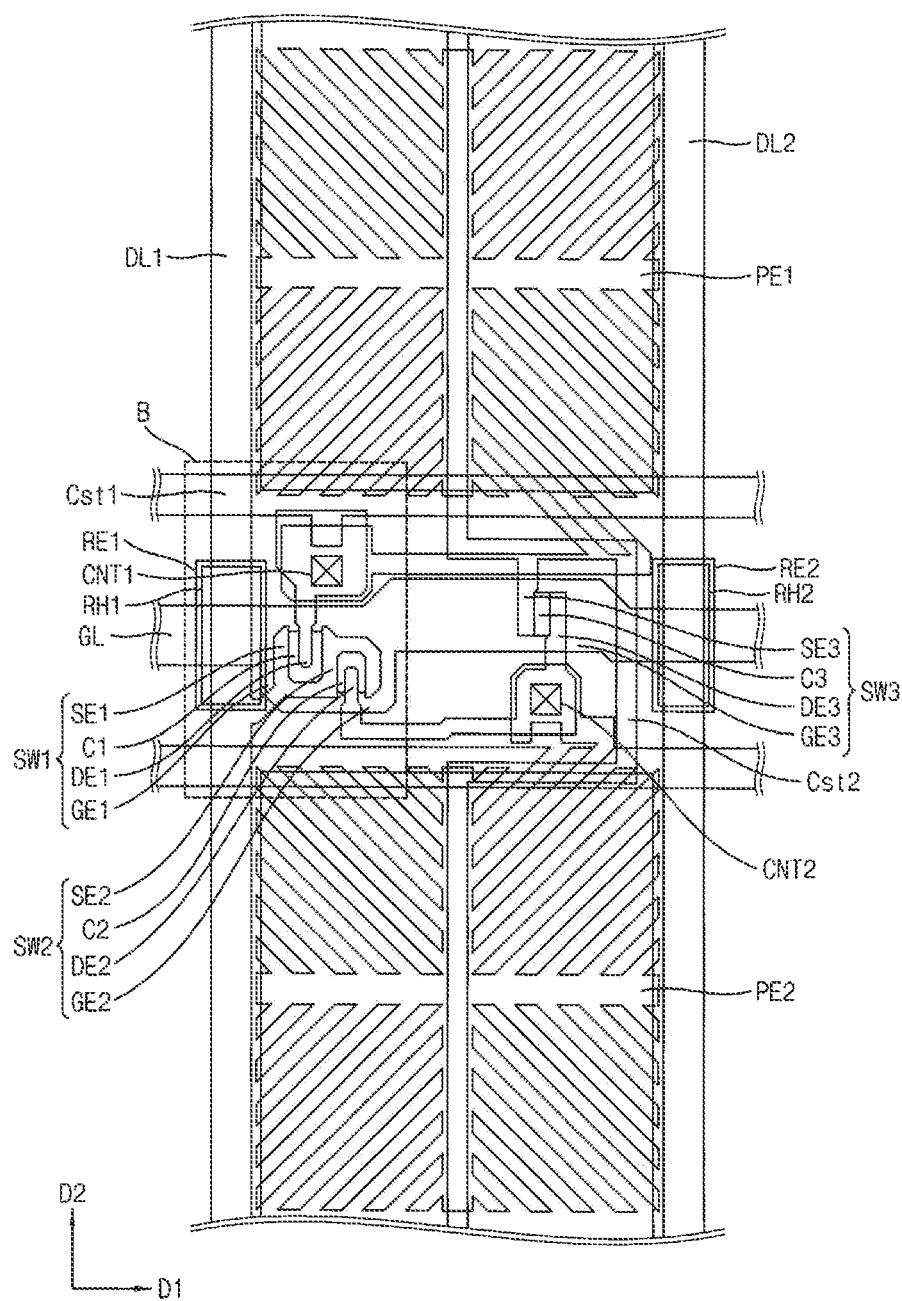
FIG. 16 is a plan view illustrating a display substrate according to an exemplary embodiment of the inventive concept.
Figure 17:
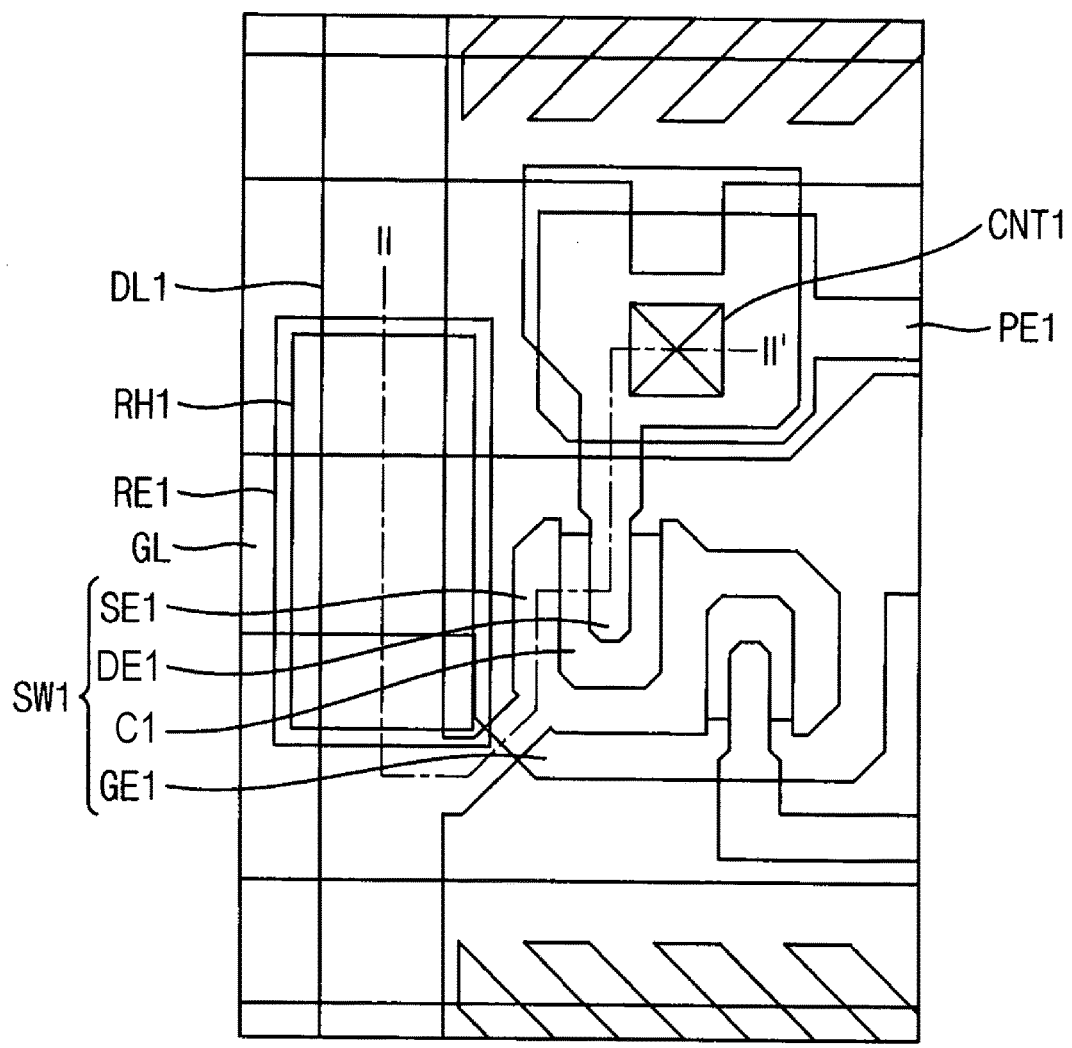
FIG. 17 is a plan view magnifying portion "B" of FIG. 16.
Figure 18:
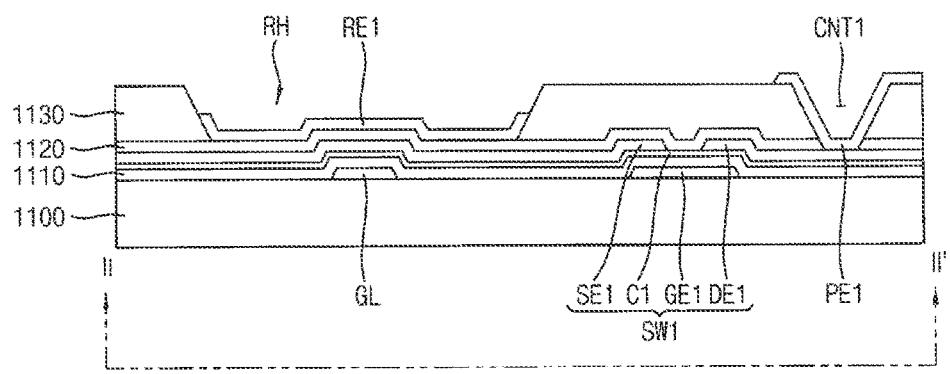
FIG. 18 is a cross-sectional view taken along the line II-II' of FIG. 17.

FIG. 16 is a plan view illustrating a display substrate according to an exemplary embodiment of the inventive concept. FIG. 17 is a plan view magnifying portion "B" of FIG. 16. FIG. 18 is a cross-sectional view taken along the line II-II' of FIG. 17.

Referring to FIGS. 16 to 17, a display substrate includes a gate line GL, a first data line DL1, a second data line DL2, a first repair hole RH1, a second repair hole RH2, a first repair electrode RE1, a second repair electrode RE2, a first storage line Cst1, a second storage line Cst2, a first switching element SW1, a second switching element SW2, a third switching element SW3, a high-pixel electrode PE1 and a low-pixel electrode PE2.

The gate line GL extends in a first direction D1. The gate line GL may have a single layer structure including copper (Cu), silver (Ag), chrome (Cr), molybdenum (Mo), aluminum (Al), titanium (Ti), manganese (Mn) and a mixture thereof. In addition, the gate line GL may have a multi-layer structure having a plurality of layers including materials different from each other. For example, the gate line GL may include a copper layer and a titanium layer disposed on and/or under the copper layer. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first data line DL1 extends in a second direction D2 substantially perpendicular to the first direction D1. The first data line DL1 may have a single layer structure including copper (Cu), silver (Ag), chrome (Cr), molybdenum (Mo), aluminum (Al), titanium (Ti), manganese (Mn) and a mixture thereof. In addition, the first data line DL1 may have a multi-layer structure having a plurality of layers including materials different from each other. For example, the first data line DL1 may include a copper layer and a titanium layer disposed on and/or under the copper layer. The first data line DL1 is electrically connected to a first source electrode SE1 of the first switching element SW1, and a second source electrode SE2 of the second switching element SW2.

The high-pixel electrode PE1 is disposed adjacent to the gate line GL in the second direction D2, and between the first data line DL1 and the second data line DL2. The high-pixel electrode PE1 is electrically connected to a first drain electrode DE1 of the first switching element SW1 through a first contact hole H1.

The low-pixel electrode PE2 is disposed opposite to the high-pixel electrode PE1 with reference to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole H2.

A first voltage may be applied to the high-pixel electrode PE1. A second voltage different from the first voltage may be applied to the low-pixel electrode PE2. For example, the first voltage may be higher than the second voltage, a portion of the pixel corresponding to the high-pixel electrode PE1 may be driven as a high pixel, and another portion of the pixel corresponding to the low-pixel electrode PE2 may be driven as a low pixel.

The first storage line Cst1 extends in a first direction D1. The first storage line Cst1 overlaps with the high-pixel electrode PE1. The first storage line Cst1 may be formed from the same layer as the gate line GL. Thus, the first storage line Cst1 may be disposed on the same layer as the gate line GL. The first storage line Cst1 may have a single layer structure including copper (Cu), silver (Ag), chrome (Cr), molybdenum (Mo), aluminum (Al), titanium (Ti), manganese (Mn) and a mixture thereof. In addition, the first storage line Cst1 may have a multi-layer structure having a plurality of layers including materials different from each other. For example, the first storage line Cst1 may include a copper layer and a titanium layer disposed on and/or under the copper layer.

The second storage line Cst2 may be formed from the same layer as the data line DL. Thus, the second storage line Cst2 may be disposed on the same layer as the data line DL. The second storage line Cst2 may have a single layer structure including copper (Cu), silver (Ag), chrome (Cr), molybdenum (Mo), aluminum (Al), titanium (Ti), manganese (Mn) and a mixture thereof. In addition, the second storage line Cst2 may have a multi-layer structure having a plurality of layers including materials different from each other. For example, the second storage line Cst2 may include a copper layer and a titanium layer disposed on and/or under the copper layer. The second storage line Cst2 is electrically connected to a third source electrode SE3 of the third switching element SW3.

A second insulation layer 1120 is formed on the first data line DL1 and the second storage line Cst2. The second insulation layer 1120 may include inorganic material such as silicon oxide (SiOx) and/or silicon nitride (SiNx). For example, the second insulation layer 1120 includes silicon oxide (SiOx), and may have thickness about 500 Å. In addition, the second insulation layer 1120 may include a plurality of layers including materials different from each other.

An organic layer 1130 is formed on the second insulation layer 1120. The organic insulating layer 1130 may planarizes an upper surface of the display substrate, so that problems due to the step such as disconnection of a signal line may be prevented. The organic layer 1130 may be an insulation layer including an organic material. For example, the organic layer 1130 may be a color filter layer.

A pixel electrode is formed on the organic layer 1130. The pixel electrode may include a high-pixel electrode PE1 and a low-pixel electrode PE2.

The high-pixel electrode PE1 and the low-pixel electrode PE2 may include a transparent conductive material, such as indium tin oxide (ITO), indium zinc oxide (IZO) and etc. In addition, the high-pixel electrode PE1 and the low-pixel electrode PE2 may include titanium (Ti) and/or molybdenum titanium (MoTi).

A repair hole is formed through the organic layer 1130. The repair hole may include a first repair hole RH1 and a second repair hole RH2. The first repair hole RH1 is disposed in a crossing area in which the first data line DL1 crosses with the gate line GL. The second repair hole RH2 is disposed in a crossing area in which the second data line DL2 crosses with the gate line GL.

The first repair hole RH1 exposes the crossing area in which the first data line DL1 crosses with the gate line GL. An extent of the first repair hole RH1 may be bigger than an extent of the crossing area in which the first data line DL1 crosses with the gate line GL.

A first repair electrode RE1 is formed on the first repair hole RH1. The first repair electrode RE1 covers the first repair hole RH1. The first repair electrode RE1 may include a transparent conductive material, such as indium tin oxide (ITO), indium zinc oxide (IZO) and etc. In addition, the first repair electrode RE1 may include titanium (Ti) and/or molybdenum titanium (MoTi).

The first repair electrode RE1 may include the same material as the high-pixel electrode PE1 and the low-pixel electrode PE2. The first repair electrode RE1 may be disposed on the same layer as the high-pixel electrode PE1 and the low-pixel electrode PE2.

The first channel portion C1 may include a semiconductor layer consisting of amorphous silicon (a-Si:H) and an ohmic contact layer consisting of n+ amorphous silicon (n+ a-Si:H). In addition, the first channel portion C1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion C2 connecting the second source electrode SE2 to the second drain electrode DE2.

The second channel portion C2 may include a semiconductor layer consisting of amorphous silicon (a-Si:H) and an ohmic contact layer consisting of n+ amorphous silicon (n+a-Si:H). In addition, the second channel portion C2 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion C3 connecting the third source electrode SE3 to the third drain electrode DE3.

The third channel portion C3 may include a semiconductor layer consisting of amorphous silicon (a-Si:H) and an ohmic contact layer consisting of n+ amorphous silicon (n+a-Si:H). In addition, the third channel portion C3 may include an oxide semiconductor. The oxide semiconductor may include an amorphous oxide including at least one selected from the group consisting of indium (In), zinc (Zn), gallium (Ga), tin (Sn) and hafnium (Hf).

When a color filter is disposed on the same lower substrate as the gate line and the data line, the color filter covers the data line. Thus, a repair of the data line is impossible. That is, since the color filter covers the data line, a cutting using a laser may be failed. In addition, since a repair line is not contacted with the data line, a repair may be impossible.

However, a display substrate according to an exemplary embodiment of the inventive concept includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

In addition, a display substrate according to an exemplary embodiment of the inventive concept a repair electrode covering the repair hole. Thus, repair of a line on which failure is generated may be possible without forming a repair line. For example, a laser beam is irradiated onto the repair electrode to repair the line on which failure is generated.

When the repair line is formed, the repair line is formed on the line on which failure is generated. However, display substrate according to an exemplary embodiment of the inventive concept includes a repair electrode formed on every repair hole.

FIGS. 19 to 23 are cross-sectional views illustrating a method of manufacturing the display substrate of FIG. 18.

Figure 19:
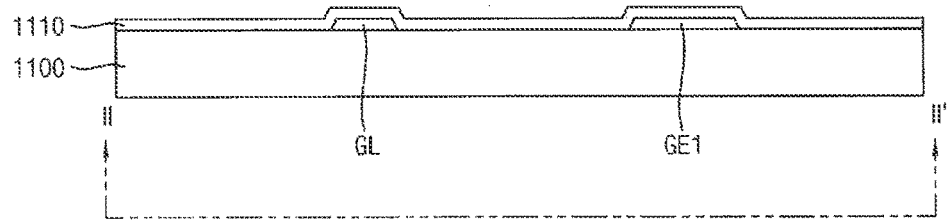
FIGS. 19 to 23 are cross-sectional views illustrating a method of manufacturing the display substrate of FIG. 18.

Referring to FIG. 19, a gate metal layer is formed on a base substrate 1100, and then the gate metal layer may be partially etched by a photolithography process or an etching process using an additional etching mask. Hence, the gate pattern is formed. The gate pattern includes a first storage line Cst1, a gate line GL, a first gate electrode GE1, a second gate electrode GE2 and a third gate electrode GE3.

The base substrate 1100 may include a material which has relatively high transmittance, thermal resistance, and chemical resistance. For example the base substrate 1100 may include any one selected from the group consisting of glass, polyethylenenaphthalate, polyethylene terephthalate, polyacryl and a mixture thereof.

The gate pattern may include a metal, a metal alloy, a metal nitride, a conductive metal oxide, a transparent conductive material, and etc. For example, the gate pattern may include copper (Cu) which is opaque.

The first insulation layer 1110 is disposed on the base substrate on which gate pattern is formed. The first insulation layer 1110 is disposed on the gate pattern. The first insulation layer 1110 covers and insulates the first storage line Cst1, the gate line GL, the first gate electrode GE1, the second gate electrode GE2 and the third gate electrode GE3.

Figure 20:
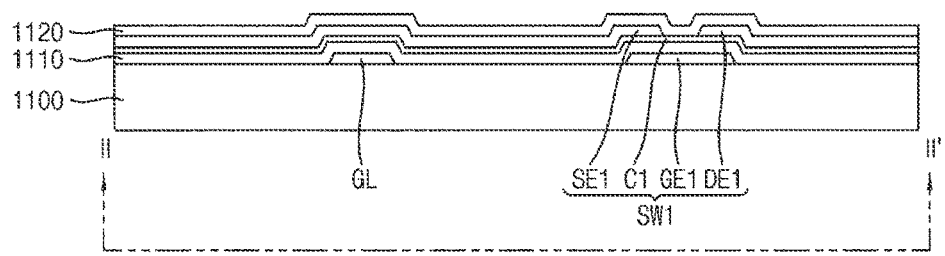

Referring to FIG. 20, a semiconductor layer and a data metal layer are formed on a base substrate 1100 on which the first insulation layer 1110 is formed, and then the semiconductor layer and the data metal layer may be partially etched by a photolithography process or an etching process using an additional etching mask. Hence, a channel layer AP including a first channel portion C1, a second channel portion C2 and a third channel portion C3, and data pattern are formed. The semiconductor layer may include a silicon semiconductor layer consisting of amorphous silicon (a-Si:H) and an ohmic contact layer consisting of n+ amorphous silicon (n+ a-Si:H). In addition, the semiconductor layer may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode SE1, a second source electrode SE2, a second drain electrode DE2, a third source electrode SE3, a third drain electrode DE3, a first data line DL1 and a second data line DL2. For example, the semiconductor later and the metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 and the second drain electrode DE2 spaced apart from the second source electrode SE2 may be formed by removing a portion of the patterned metal layer. In addition, the third source electrode SE3 and the third drain electrode DE3 spaced apart from the third source electrode SE3 may be formed by removing a portion of the patterned metal layer.

A second insulation layer 1120 is formed on the base substrate 1100 on which the data pattern and the channel layer AP are formed.

The second insulation layer 1120 may be formed by a spin coating process, a printing process, a sputtering process, a CVD process, an ALD process, a PECVD process, an HDP-CVD process or a vacuum evaporation process in accordance with ingredients included in the second insulation layer 1120. The second insulation layer 1120 is disposed on the data pattern. The second insulation layer 1120 covers and insulates the first drain electrode DE1, the first source electrode SE1, the second source electrode SE2, the second drain electrode DE2, the third source electrode SE3, the third drain electrode DE3 and the first data line (refers to DL 1 of FIG. 16).

Figure 21:
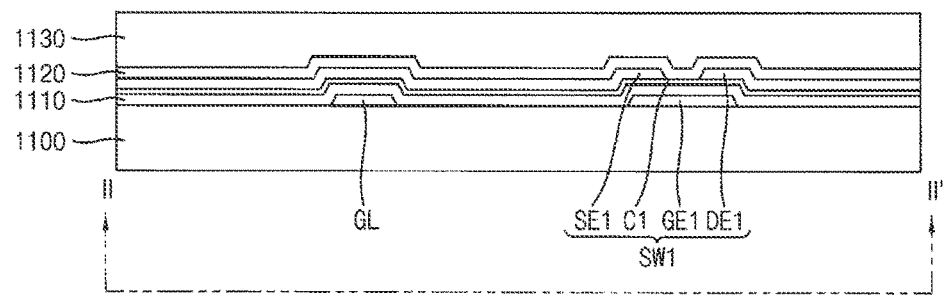

Referring to FIG. 21, an organic layer 1130 is formed on the base substrate 1100 on which the second insulation layer 1120 is formed. The organic layer 1130 may be a color filter layer. A photoresist is formed on the second insulation layer 1120, and then the photoresist is exposed using a mask, and then the photoresist is developed using a developing solution. Hence, the organic layer 1130 may be formed.

The organic layer 1130 is disposed on the second insulation layer 1120. When the organic layer 1130 is color filter layer, the color filter layer supplies colors to the light passing through the liquid crystal layer. The color filter layer may include a red color filter layer, a green color filter layer and blue color filter layer. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels.

Figure 22:
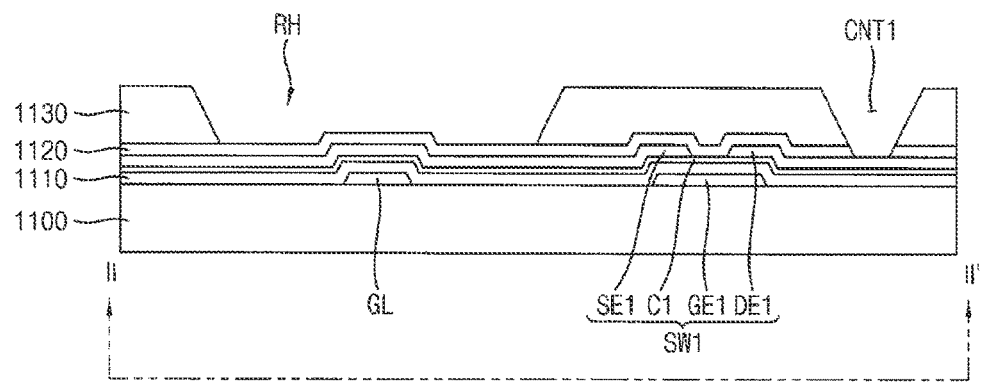

Referring to FIG. 22, the organic layer 1130 is patterned to form a first repair hole RH1 and a first contact hole CNT1.

The first repair hole RH1 is disposed in a crossing area in which the first data line DL1 crosses with the gate line GL. The first repair hole RH1 exposes the crossing area in which the first data line DL1 crosses with the gate line GL. An extent of the first repair hole RH1 may be bigger than an extent of the crossing area in which the first data line DL1 crosses with the gate line GL.

The first contact hole CNT1 is formed through the organic layer 1130 and the second insulation layer 1120. The first contact hole CNT1 exposes a portion of the first drain electrode DE1.

Figure 23:
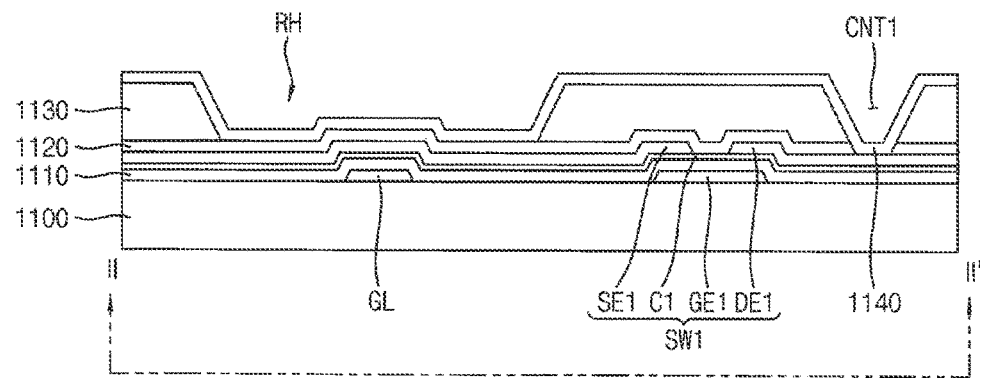

Referring to FIG. 23, a transparent electrode layer 1140 is formed of the base substrate 1100 on which the first repair hole RH1 and the first contact hole CNT1 are formed. The transparent electrode layer 1140 may include a transparent conductive material, such as indium tin oxide (ITO), indium zinc oxide (IZO) and etc. In addition, the transparent electrode layer 1140 may include titanium (Ti) and/or molybdenum titanium (MoTi).

Referring to FIG. 18, the transparent electrode layer 1140 is patterned to form a high-pixel electrode PE1 and a first repair electrode RE1.

The high-pixel electrode PE1 may include a transparent conductive material, such as indium tin oxide (ITO), indium zinc oxide (IZO) and etc. In addition, the high-pixel electrode PE1 may include titanium (Ti) and/or molybdenum titanium (MoTi).

The high-pixel electrode PE1 is electrically connected to the first drain electrode DE1 through the first contact hole CNT1.

The first repair electrode RE1 is formed on the first repair hole RH1. The first repair electrode RE1 covers the first repair hole RH1. The first repair electrode RE1 may include a transparent conductive material, such as indium tin oxide (ITO), indium zinc oxide (IZO) and etc. In addition, the first repair electrode RE1 may include titanium (Ti) and/or molybdenum titanium (MoTi).

The first repair electrode RE1 may include the same material as the high-pixel electrode PE1 and the low-pixel electrode PE2. The first repair electrode RE1 may be disposed on the same layer as the high-pixel electrode PE1 and the low-pixel electrode PE2.

When a color filter is disposed on the same lower substrate as the gate line and the data line, the color filter covers the data line. Thus, a repair of the data line is impossible. That is, since the color filter covers the data line, a cutting using a laser may be failed. In addition, since a repair line is not contacted with the data line, a repair may be impossible.

However, a display substrate according to an exemplary embodiment of the inventive concept includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

In addition, a display substrate according to an exemplary embodiment of the inventive concept a repair electrode covering the repair hole. Thus, repair of a line on which failure is generated may be possible without forming a repair line. For example, a laser beam is irradiated onto the repair electrode to repair the line on which failure is generated.

When the repair line is formed, the repair line is formed on the line on which failure is generated. However, display substrate according to an exemplary embodiment of the inventive concept includes a repair electrode formed on every repair hole.

Figure 24:
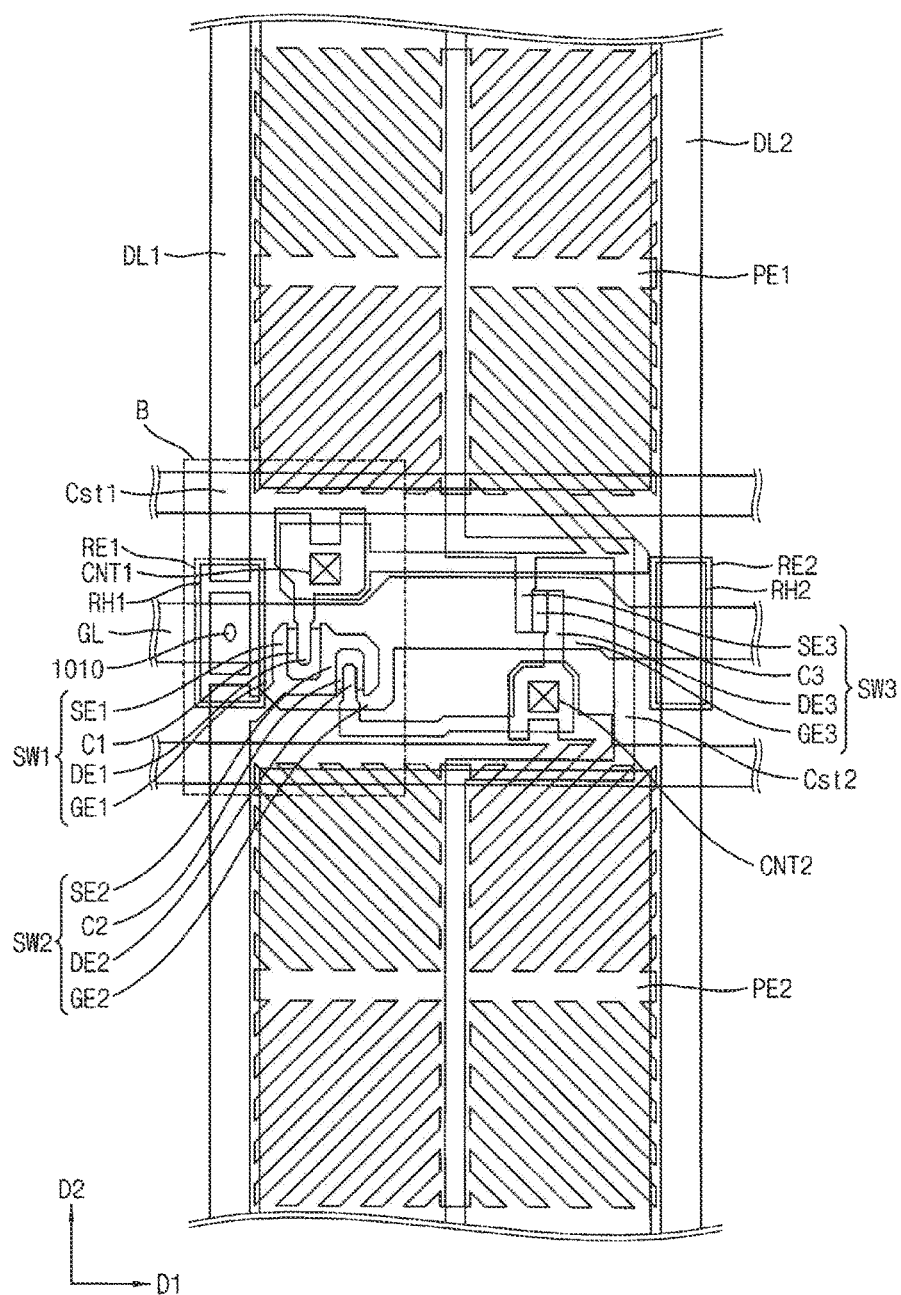
FIG. 24 is a plan view illustrating a display substrate repaired by a method of repairing a display substrate according to an exemplary embodiment of the inventive concept.

FIG. 24 is a plan view illustrating a display substrate repaired by a method of repairing a display substrate according to an exemplary embodiment of the inventive concept.

Figure 25:
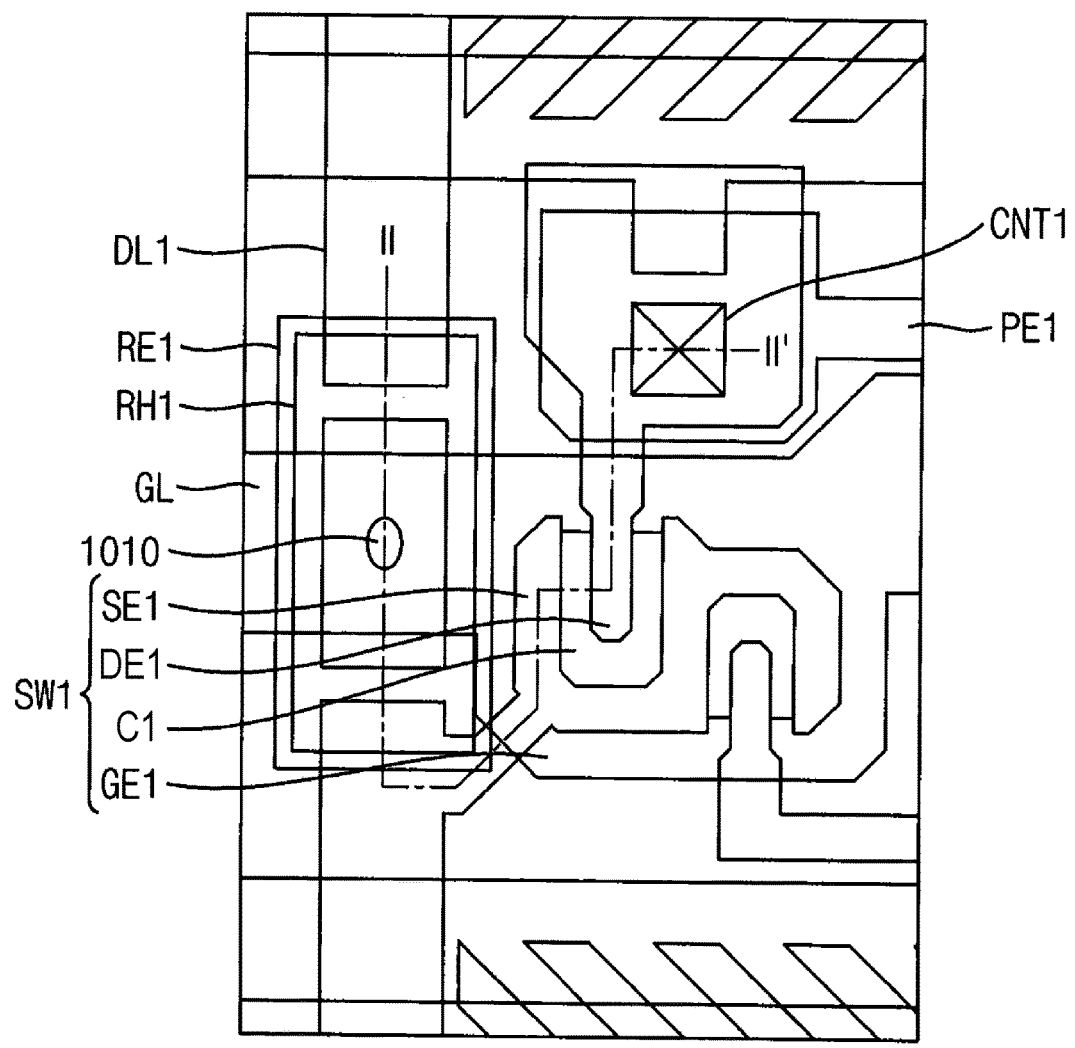
FIG. 25 is a plan view magnifying portion "B" of FIG. 24.
Figure 26:
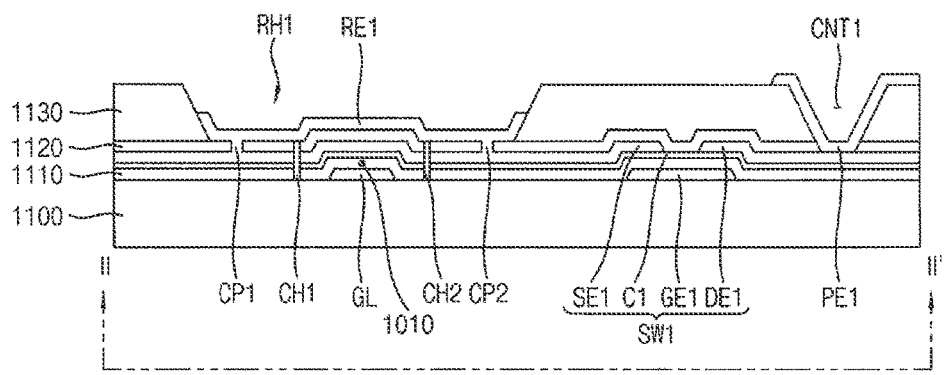
FIG. 26 is a cross-sectional view taken along the line II-II' of FIG. 25.

FIG. 25 is a plan view magnifying portion "B" of FIG. 24. FIG. 26 is a cross-sectional view taken along the line II-II' of FIG. 25.

Referring to FIGS. 24 to 26, a shorting failure 1010 is generated at a crossing area in which the first data line GL1 crosses with the gate line GL.

A first cutting groove CH1 and a second cutting groove CH2 are formed to disconnect the first data line DL1. An electrical connection failure results in a shorting failure 1010 that is generated at a crossing area in which the gate line and the data line cross each other and disposed between the first and second disconnecting grooves. Particularly, a laser beam is irradiated onto the first data line DL1 along a first direction D1 substantially perpendicular to a longitudinal direction of the first data line DL1 to form the first and second cutting grooves CH1 and CH2. The laser beam may be a pulse laser beam. For example, Examples of a wavelength of the pulse laser beam may be about 1063 nm, about 532 nm, about 355 nm, etc.

The first repair electrode RE1 is electrically connected to the first data line DL1 on a first connecting point CP1 and a second connecting point CP2. A laser beam is irradiated onto the first repair electrode RE1 to form the first connecting point CP1 and the second connecting point CP2.

The first repair electrode RE1 is formed on the first repair hole RH1, and electrically connects the first data line DL1 that is electrically insulated from each other by the first and second cutting grooves CH1 and CH2. Thus, the first repair electrode RE1 may repair the shorting failure 1010 to repair the display substrate 1100.

Figure 27:
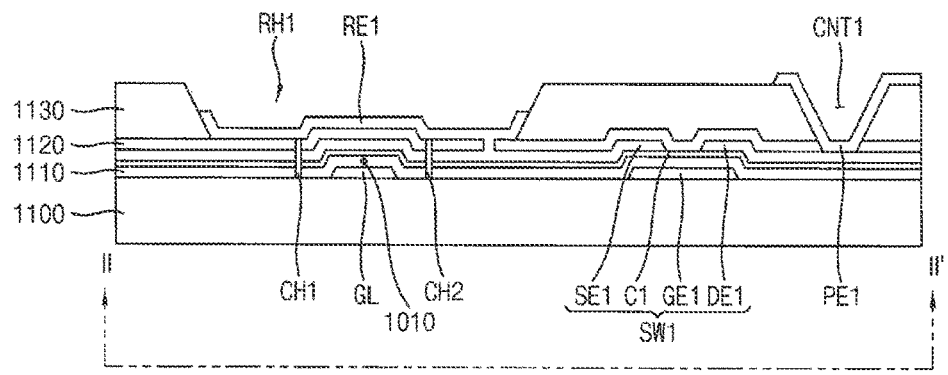
FIG. 27 is a cross-sectional view illustrating a method of repairing a display substrate of FIG. 26.

FIG. 27 is a cross-sectional view illustrating a method of repairing a display substrate of FIG. 26.

Referring to FIG. 27, a first cutting groove CH1 and a second cutting groove CH2 are formed to disconnect the first data line DL1. An electrical connection failure results in a shorting failure 1010 that is generated at a crossing area in which the gate line and the data line cross each other and disposed between the first and second disconnecting grooves. Particularly, a laser beam is irradiated onto the first data line DL1 along a first direction D1 substantially perpendicular to a longitudinal direction of the first data line DL1 to form the first and second cutting grooves CH1 and CH2. The laser beam may be a pulse laser beam. For example, Examples of a wavelength of the pulse laser beam may be about 1063 nm, about 532 nm, about 355 nm, etc.

The first data line DL1 is insulated by the first cutting groove CH1 and the second cutting groove CH2.

Referring to FIG. 26, the first connecting point CP1 and the second connecting point CP2 electrically connecting the first repair electrode RE1 and the first data line DL1 is formed.

A laser beam is irradiated onto the first repair electrode RE1 to form the first connecting point CP1 and the second connecting point CP2. The first repair electrode RE1 electrically connects the disconnected first data line DL1. The first repair electrode RE1 is electrically connected to the first data line DL1 on a first connecting point CP1 and a second connecting point CP2.

The first repair electrode RE1 covers the first repair hole RH1. The first repair electrode RE1 may include a transparent conductive material, such as indium tin oxide (ITO), indium zinc oxide (IZO) and etc. In addition, the first repair electrode RE1 may include titanium (Ti) and/or molybdenum titanium (MoTi).

The first repair electrode RE1 may include the same material as the high-pixel electrode PE1 and the low-pixel electrode PE2. The first repair electrode RE1 may be disposed on the same layer as the high-pixel electrode PE1 and the low-pixel electrode PE2.

The first repair electrode RE1 is formed on the first repair hole RH1, and electrically connects the first data line DL1 that is electrically insulated from each other by the first and second cutting grooves CH1 and CH2. Thus, the first repair electrode RE1 may repair the shorting failure 1010 to repair the display substrate 1100.

Figure 28:
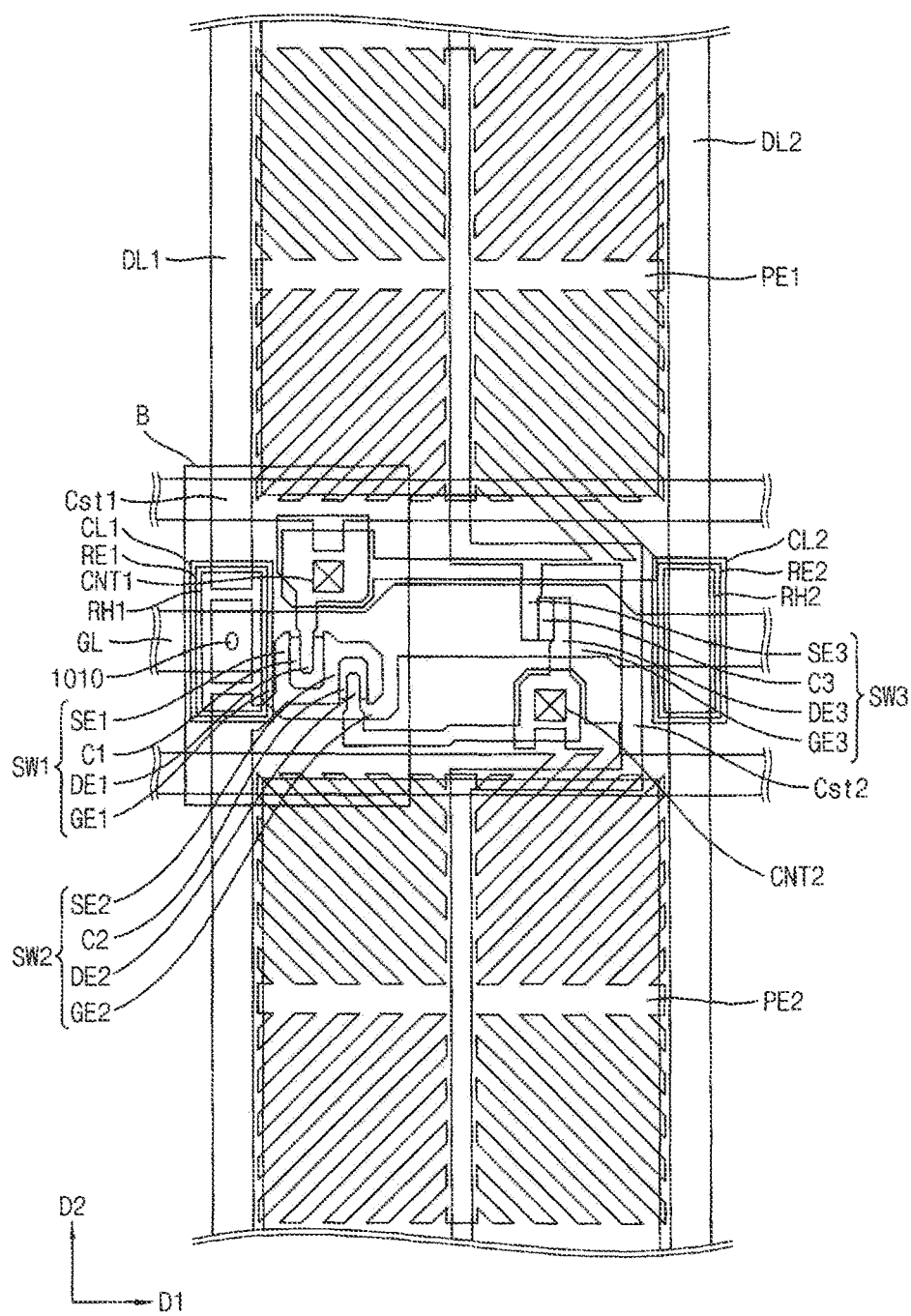
FIG. 28 is a plan view illustrating a display substrate repaired by a method of repairing a display substrate according to an exemplary embodiment of the inventive concept.
Figure 29:
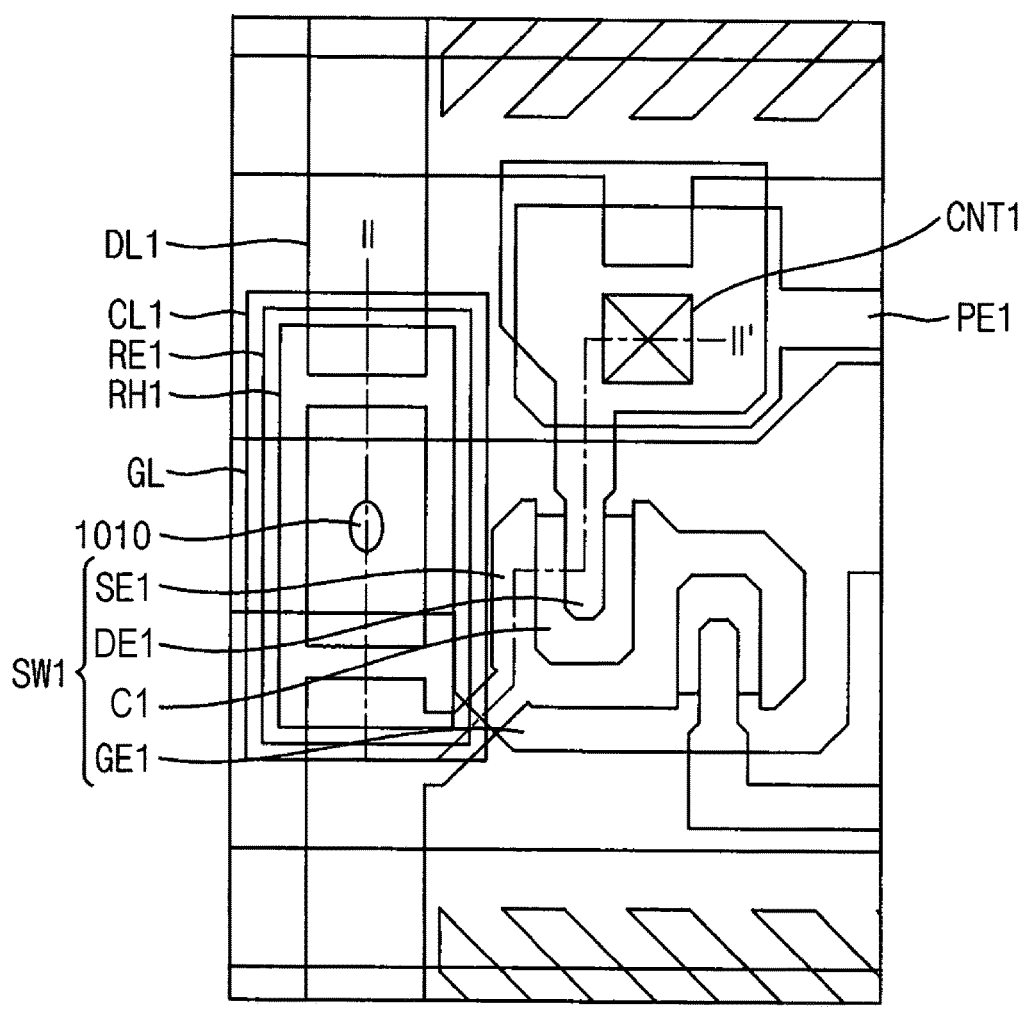
FIG. 29 is a plan view magnifying portion "B" of FIG. 28.
Figure 30:
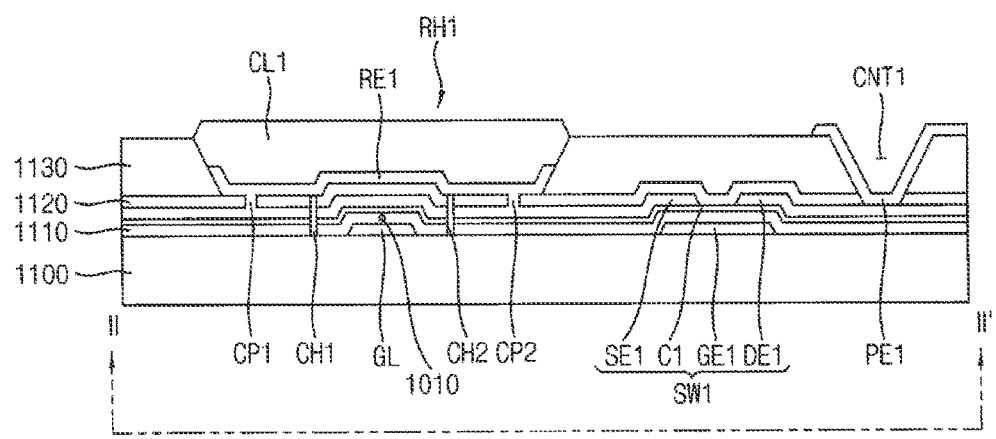
FIG. 30 is a cross-sectional view taken along the line II-II' of FIG. 29.

FIG. 28 is a plan view illustrating a display substrate repaired by a method of repairing a display substrate according to an exemplary embodiment of the inventive concept. FIG. 29 is a plan view magnifying portion "B" of FIG. 28. FIG. 30 is a cross-sectional view taken along the line II-II' of FIG. 29.

Referring to FIGS. 28 to 30, a first covering pattern CL1 is formed. The first covering pattern CL1 covers the first repair hole RH1 in which the first repair electrode RE1 is formed.

The first covering pattern CL1 covers the first repair hole RH1 and the repair line RL. The first covering pattern CL1 may disposed on the same layer as a column spacer. (not shown)

The first covering pattern CL1 covers the first repair hole RH1. Thus, defects of line due to foreign materials may be prevented. In addition, since the first covering pattern CL1 fills a space of the first repair hole RH1, a difference of height due to the first repair hole RH1 may be decreased.

According to the present exemplary embodiment, a display substrate includes a repair hole exposing a crossing area in which a data line crosses with a gate line. Since the repair hole exposes a crossing area in which a data line crosses with a gate line, a repair of the data line may be possible. Therefore, defects of a display substrate may be decreased.

In addition, a display substrate includes covering pattern covering the first repair hole. Thus, defects of line due to foreign materials may be prevented. In addition, since the covering pattern fills a space of the repair hole, a difference of height due to the repair hole RH1 may be decreased.

The foregoing is illustrative of the present invention and is not to be construed as limiting thereof. Although a few exemplary embodiments of the present invention have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display substrate, comprising:
a gate metal pattern comprising a gate line extending in a first direction and a gate electrode electrically connected to the gate line;
a data metal pattern comprising a data line extending in a second direction crossing the first direction within a crossing area encompassing a crossing of the gate line and the data line, a source electrode electrically connected to the data line and a drain electrode spaced apart from the source electrode;
an organic layer disposed on the data metal pattern;
a repair hole penetrating the organic layer and exposing the crossing area; and
a pixel electrode disposed on the organic layer and electrically connected to the drain electrode.

2. The display substrate of claim 1, further comprising:
a repair line disposed on the crossing area and electrically connected to the data line.

3. The display substrate of claim 2, further comprising:
a covering pattern covering the repair hole.

4. The display substrate of claim 1, further comprising:
a repair electrode covering the repair hole and disposed on the same layer as the pixel electrode.

5. The display substrate of claim 4, further comprising:
a covering pattern covering the repair hole and the repair electrode.

* * * * *